(12) United States Patent
Knoll et al.

(10) Patent No.: US 8,035,167 B2
(45) Date of Patent: Oct. 11, 2011

(54) COMPLEMENTARY BIPOLAR SEMICONDUCTOR DEVICE

(75) Inventors: Dieter Knoll, Frankfurt (DE); Bernd Heinemann, Frankfurt (DE); Karl-Ernst Ehwald, Frankfurt (DE)

(73) Assignee: IHP-GmbH—Innovations for High Performance Microelectronics/Leibniz-Institut fur Innovativ Mikroelektronik, Frankfurt (DE)

( * ) Notice: Subject to any disclaimer, the term of this patent is extended or adjusted under 35 U.S.C. 154(b) by 2 days.

(21) Appl. No.: 12/448,032

(22) PCT Filed: Dec. 7, 2007

(86) PCT No.: PCT/EP2007/063551
§ 371 (c)(1),
(2), (4) Date: Aug. 3, 2009

(87) PCT Pub. No.: WO2008/068340
PCT Pub. Date: Jun. 12, 2008

(65) Prior Publication Data
US 2010/0019326 A1    Jan. 28, 2010

(30) Foreign Application Priority Data
Dec. 8, 2006 (DE) .................. 10 2006 059 113

(51) Int. Cl.
*H01L 27/015* (2006.01)
(52) U.S. Cl. .. 257/369; 257/368; 257/370; 257/E27.019
(58) Field of Classification Search .......... 257/368–370, 257/E27.015
See application file for complete search history.

(56) References Cited

U.S. PATENT DOCUMENTS 4,357,622 A    11/1982    Magdo et al. .................. 357/44
(Continued)

FOREIGN PATENT DOCUMENTS

DE    19845793 A1    3/2000
(Continued)

OTHER PUBLICATIONS

IEEE BCTM 11.4 (0-7803-7800-8/03); B. El-Kareh et al.; "A 5V Complementary-SiGe BiCMOS Technology for High-Speed Precision Analog Circuits"; pp. 211-214; 2003.
(Continued)

*Primary Examiner* — Cuong Q Nguyen
*Assistant Examiner* — Tran Tran
(74) *Attorney, Agent, or Firm* — Ware, Fressola, Van Der Sluys & Adolphson LLP

(57) ABSTRACT

A complementary bipolar semiconductor device (CBi semiconductor device) comprising a substrate of a first conductivity type, active bipolar transistor regions in the substrate, in which the base, emitter and collector of vertical bipolar transistors are arranged, vertical epitaxial-base npn bipolar transistors in a first subset of the active bipolar transistor regions, vertical epitaxial-base pnp bipolar transistors in a second subset of the active bipolar transistor regions, collector contact regions which are respectively arranged adjoining an active bipolar transistor region, and shallow field insulation regions which respectively laterally delimit the active bipolar transistor regions and the collector contact regions, wherein arranged between the first or the second or both the first and also the second subset of active bipolar transistor regions on the one hand and the adjoining collector contact regions on the other hand is a respective shallow field insulation region of a first type with a first depthwise extent in the direction of the substrate interior and shallow field insulation regions of a second type of a second greater depthwise extent than the first depthwise extent of the active bipolar transistor regions delimit the active bipolar transistor regions and collector contact regions viewed in cross-section at their sides facing away from each other.

9 Claims, 27 Drawing Sheets

U.S. PATENT DOCUMENTS

| | | | |
|---|---|---|---|
| 6,169,007 B1 | 1/2001 | Pinter | 438/320 |
| 6,465,318 B1 | 10/2002 | Ehwald et al. | 438/341 |
| 6,767,797 B2 | 7/2004 | Krutsick | 438/322 |
| 6,972,237 B2 | 12/2005 | Verma et al. | 438/312 |
| 7,038,255 B2 | 5/2006 | Bottner et al. | 257/197 |
| 7,323,390 B2 | 1/2008 | Heinemann et al. | 438/282 |
| 2003/0020166 A1 | 1/2003 | Kondo et al. | 257/758 |
| 2003/0146468 A1 | 8/2003 | Gris et al. | 257/322 |
| 2005/0029624 A1 | 2/2005 | Bottner et al. | 257/552 |
| 2005/0035412 A1 | 2/2005 | Norstrom et al. | 257/370 |
| 2005/0145953 A1 | 7/2005 | Chan et al. | 257/378 |

FOREIGN PATENT DOCUMENTS

| | | |
|---|---|---|
| DE | 10160509 A1 | 6/2003 |
| DE | 10328008 B4 | 4/2008 |
| EP | 0032550 A1 | 12/1980 |
| JP | 11-17039 | 1/1999 |
| WO | WO 03/036724 | 5/2003 |
| WO | WO 2005/055289 | 6/2006 |

OTHER PUBLICATIONS

IEEE IEDM (0-7803-7873-3/03); B. Heinemann et al.; "A Complementary BiCMOS Technology with High Speed npn and pnp SiGe:C HBTs"; pp. 117-120; 2003.

IEEE IEDM (0-7803-6438-4/00); D. Singh et al.; "Novel Epitaxial $p$-Si/$n$-Si$_{1-y}$C$_y$/$p$-Si Heterojunction Bipolar Transistors"; pp. 749-752; 2000.

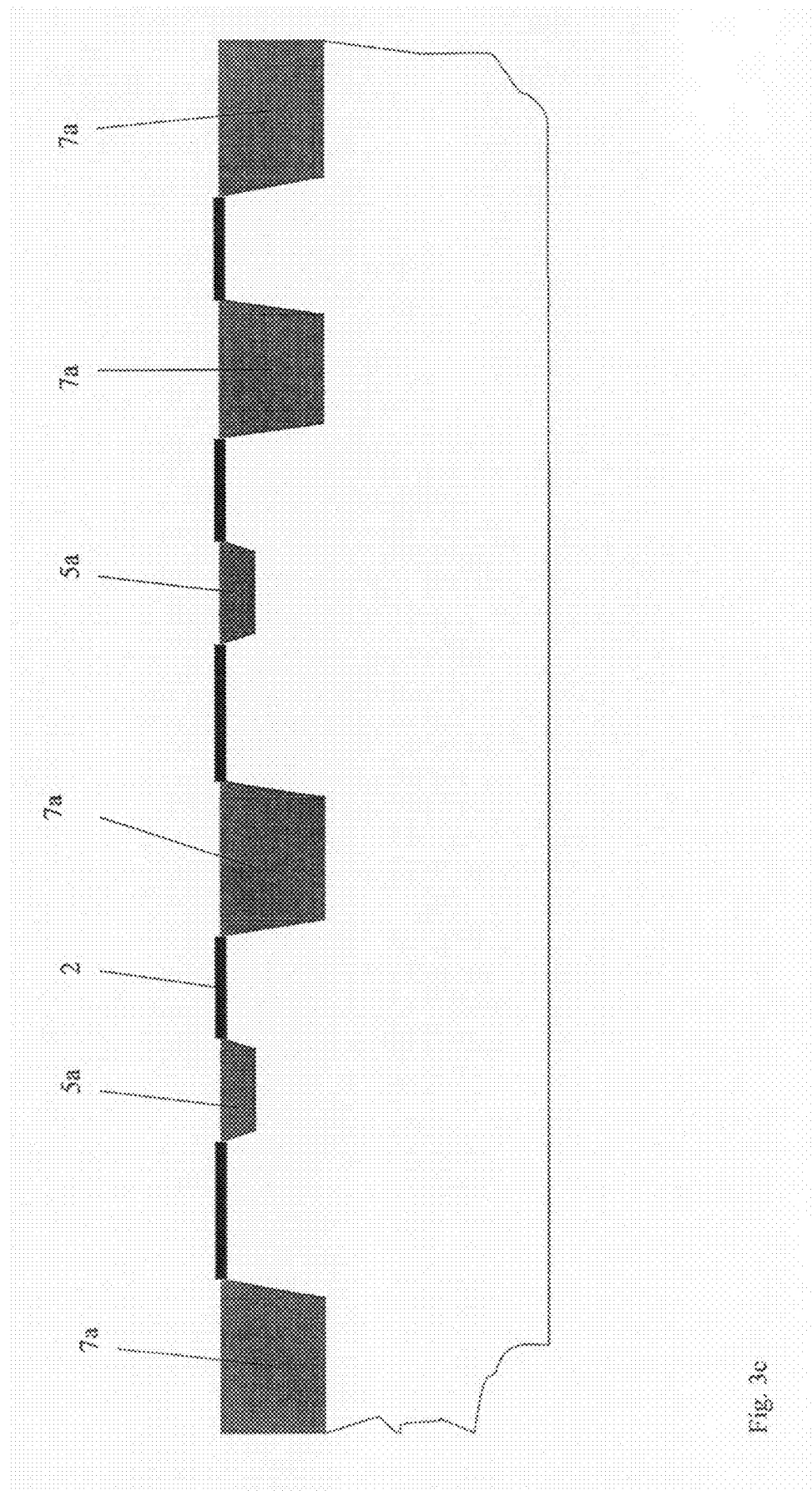

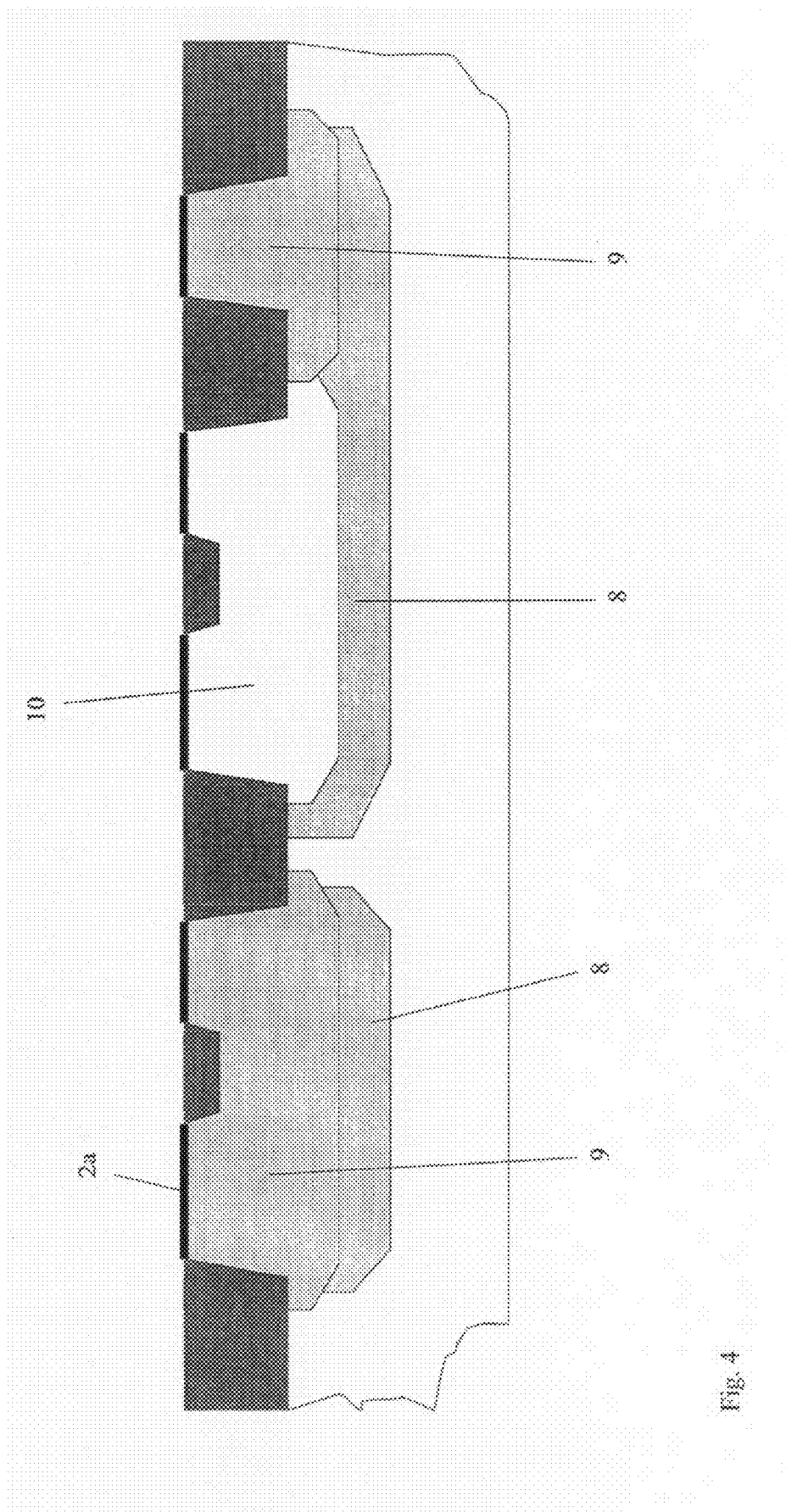

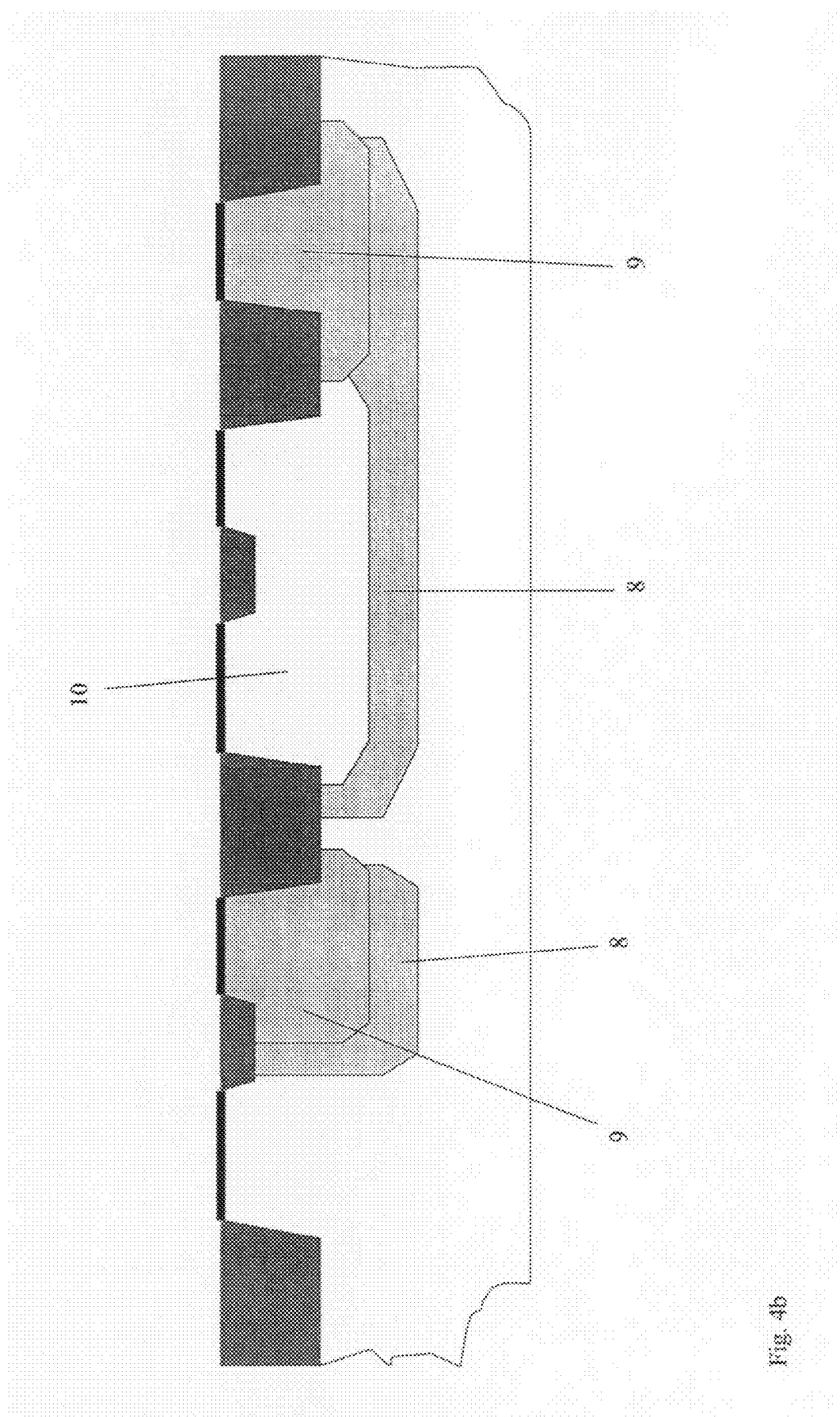

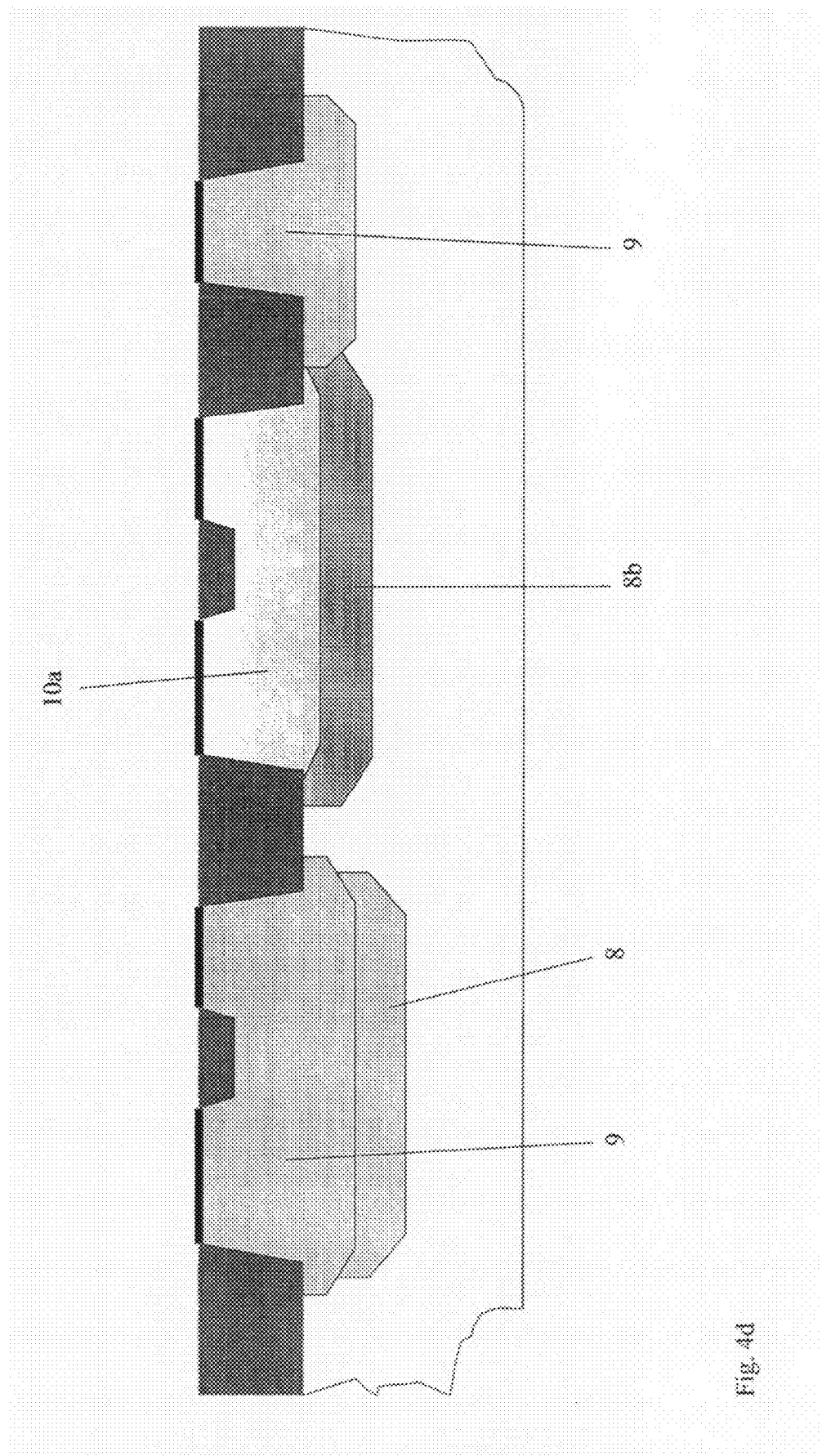

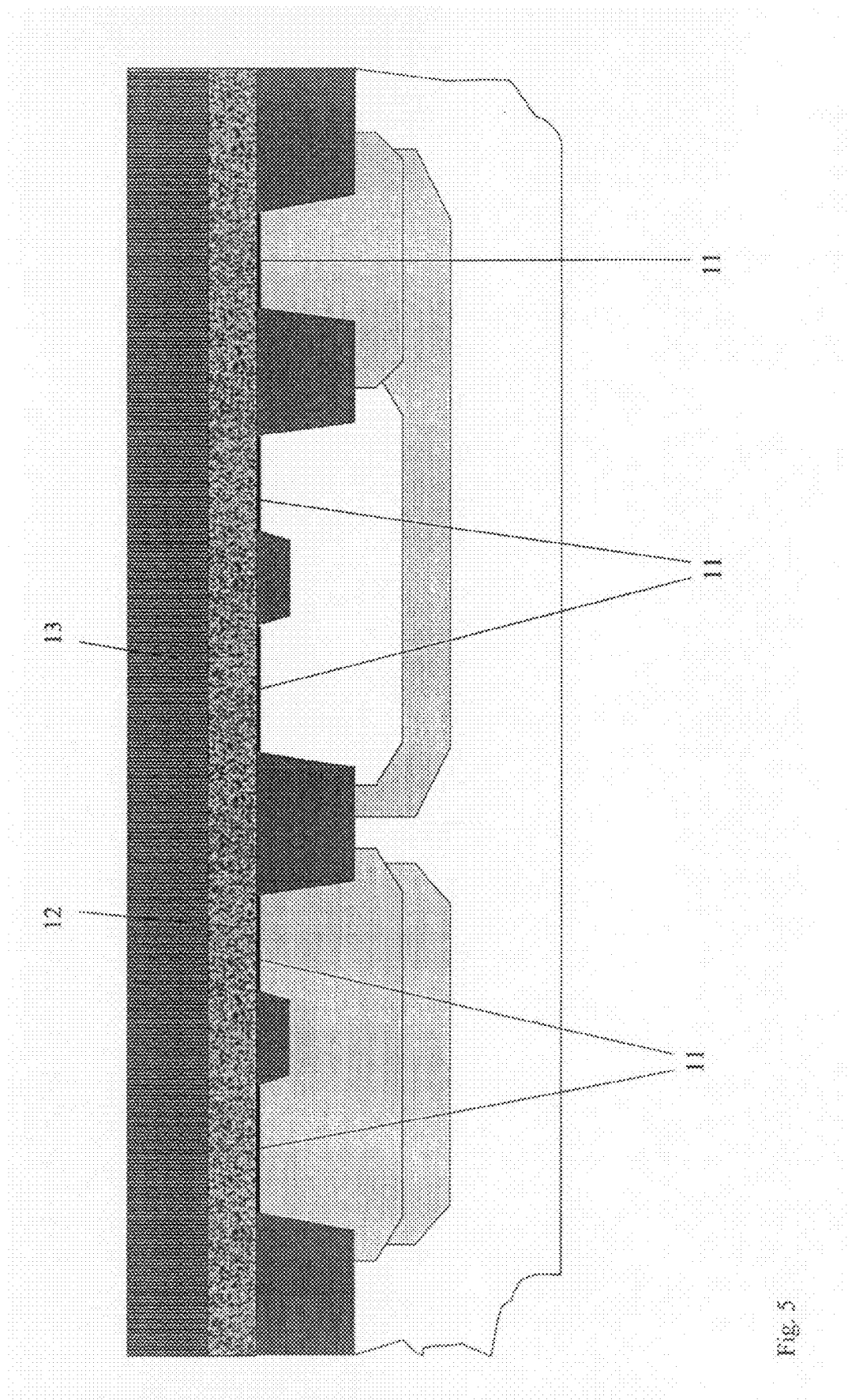

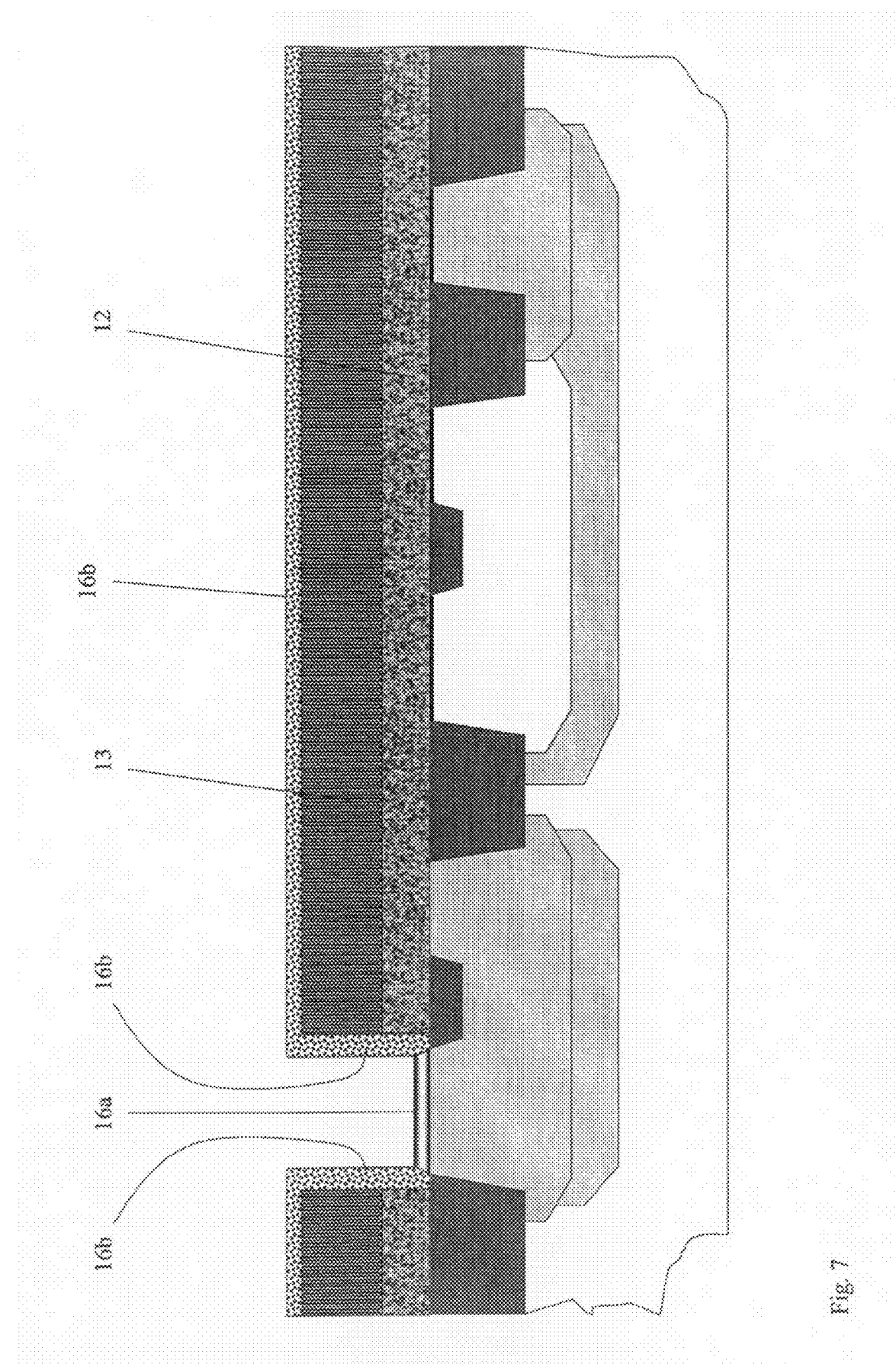

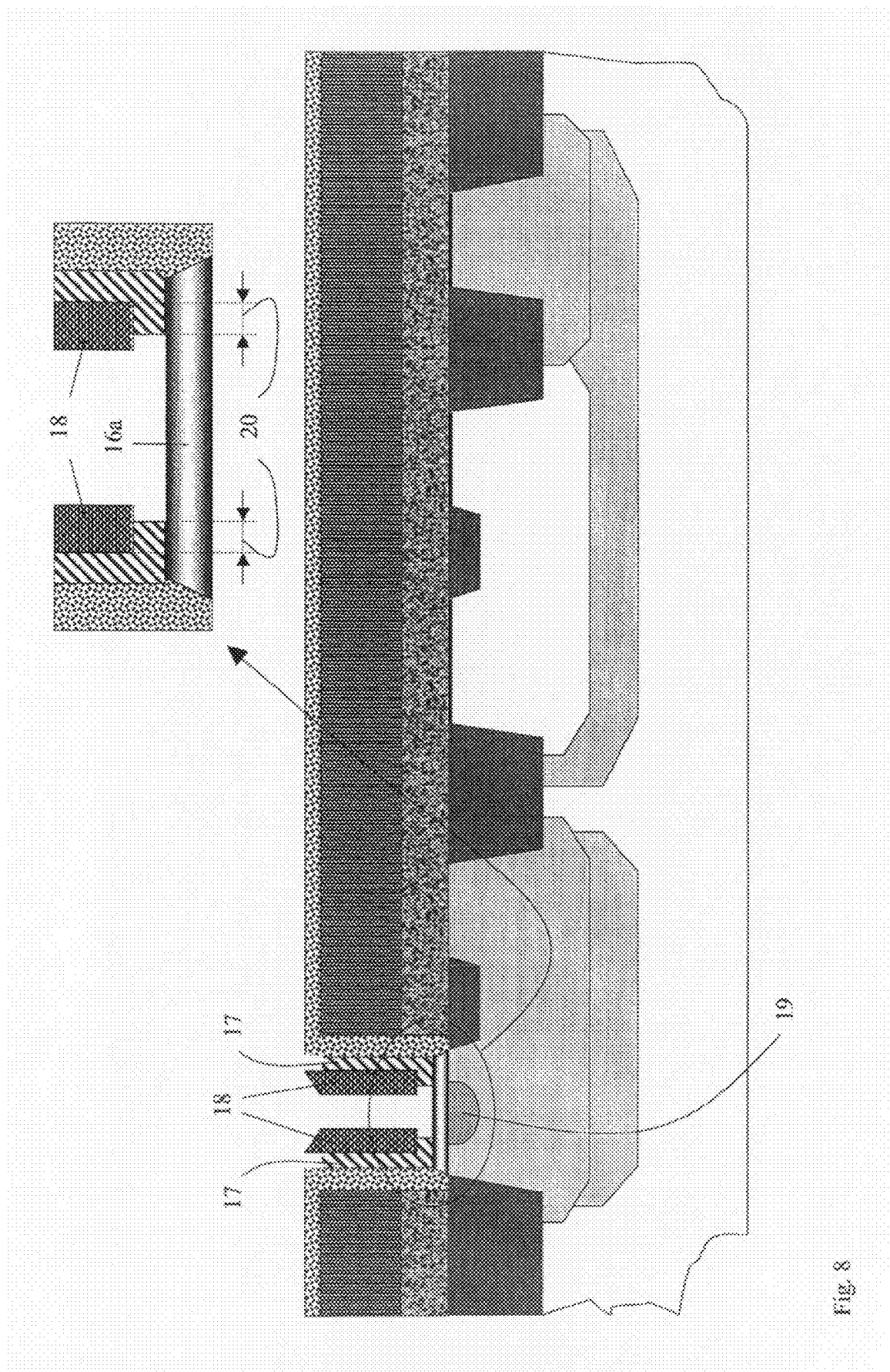

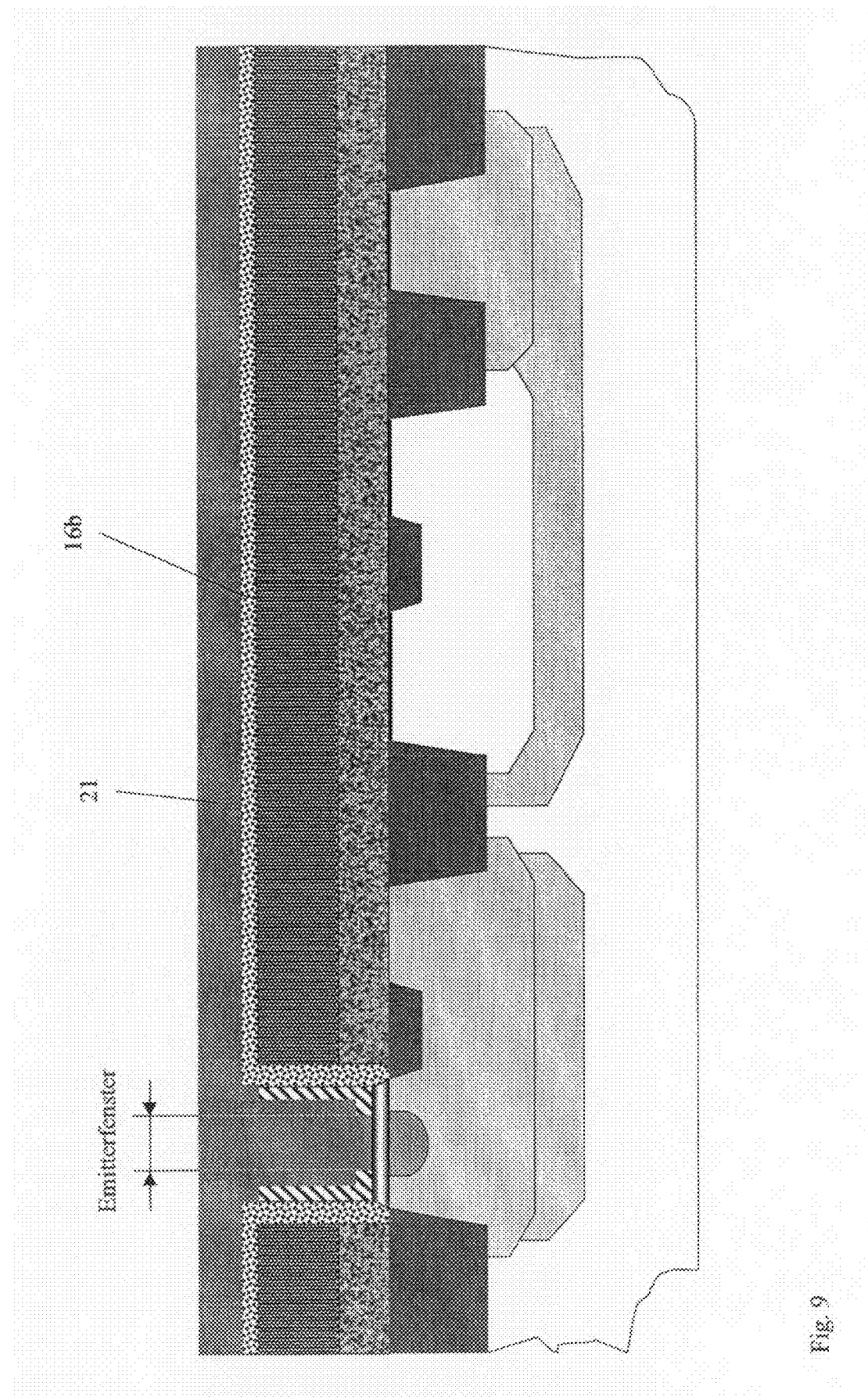

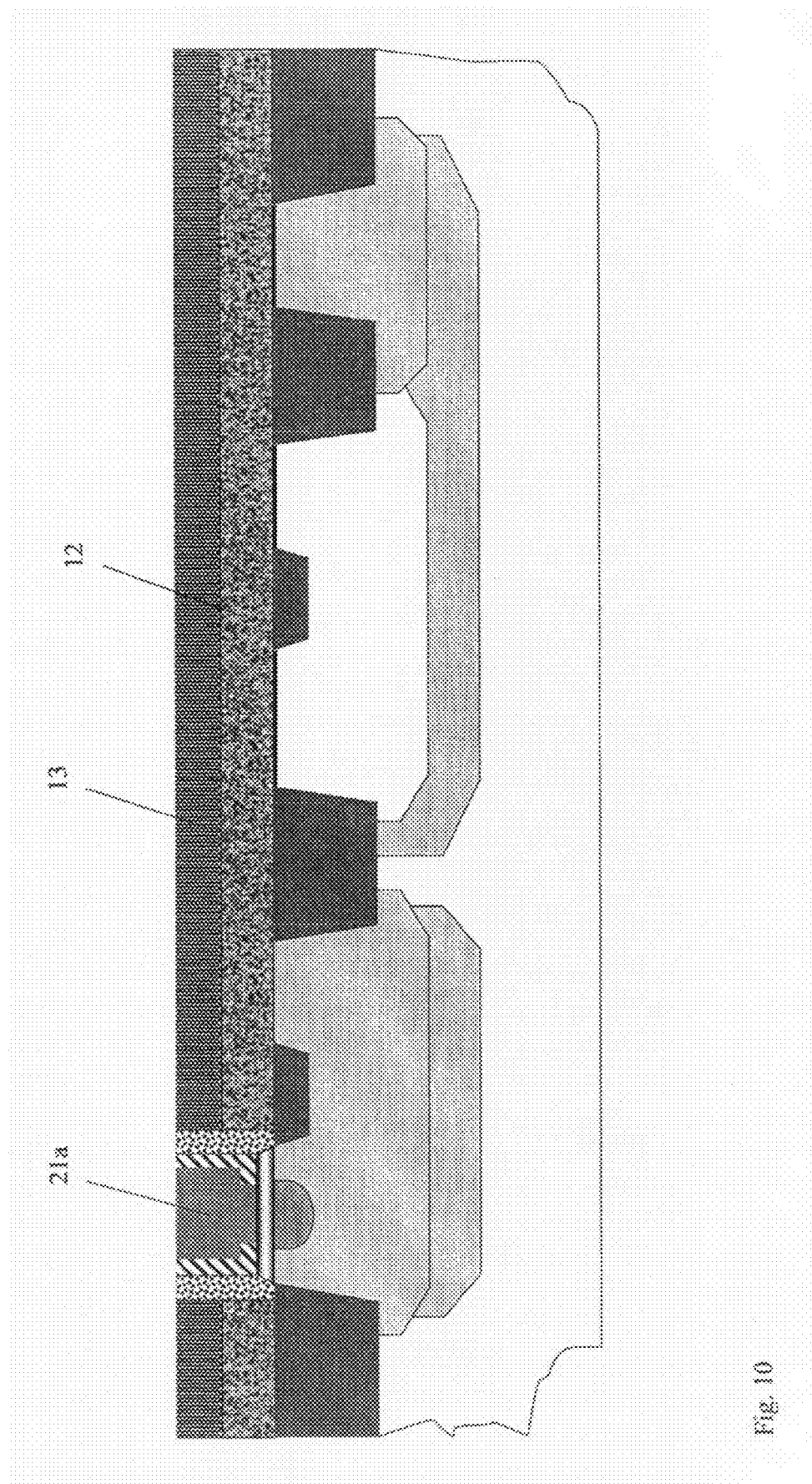

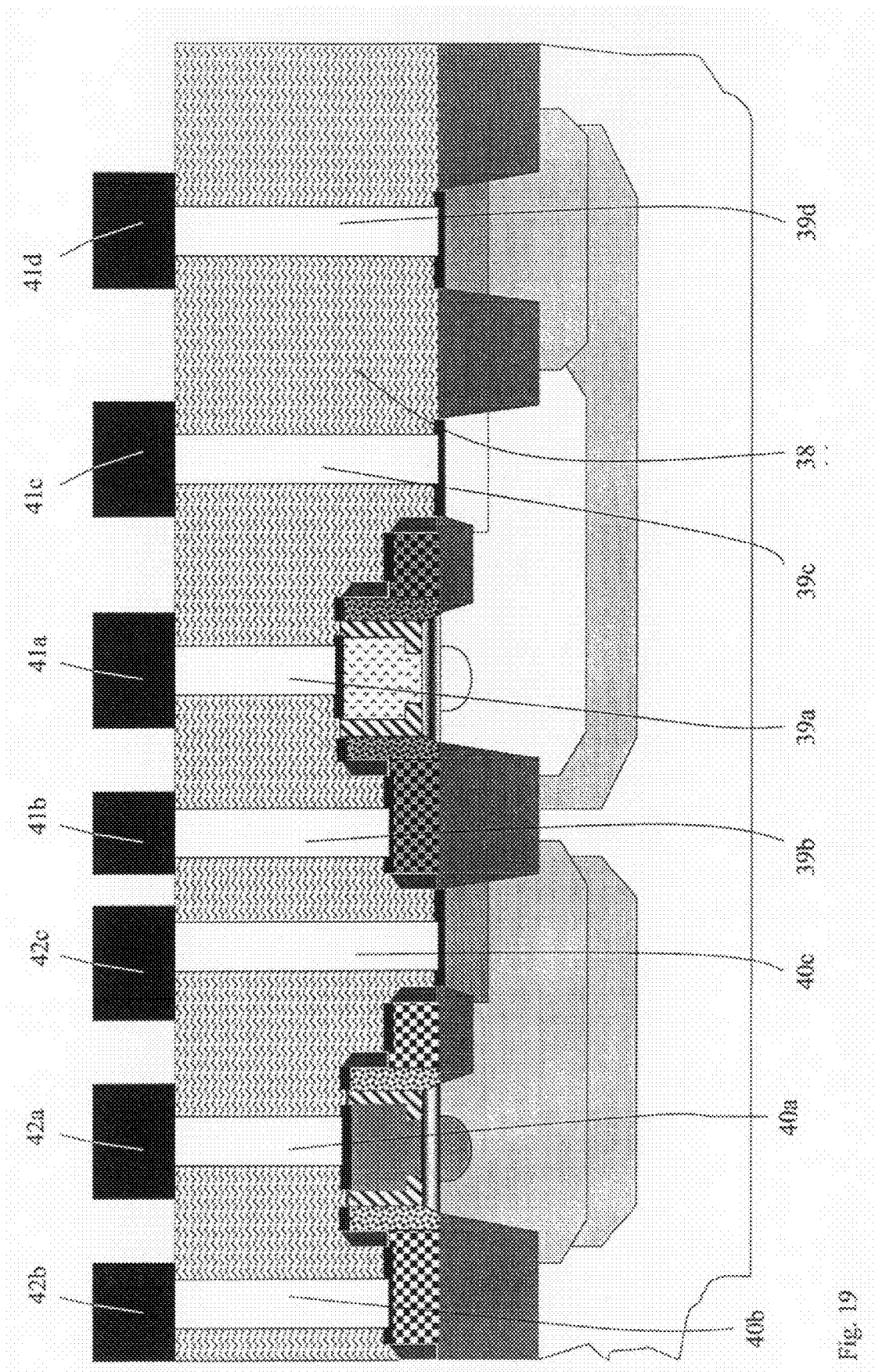

COMPLEMENTARY BIPOLAR SEMICONDUCTOR DEVICE

CROSS REFERENCE TO RELATED APPLICATIONS

This application is for entry into the U.S. national phase under §371 for International Application No. PCT/EP2007/063551 having an international filing date of Dec. 7, 2007, and from which priority is claimed under all applicable sections of Title 35 of the United States Code including, but not limited to, Sections 120, 363 and 365(c), and which in turn claims priority under 35 USC §119 to German Patent Application No. 10 2006 059 113.5 filed on Dec. 8, 2006.

BACKGROUND OF THE INVENTION

1. Technical Field

The invention concerns a complementary bipolar semiconductor device, hereinafter also referred to as a CBi semiconductor device, comprising
a substrate of a first conductivity type,
active bipolar transistor regions in the substrate, in which the base, emitter and collector of vertical bipolar transistors are arranged,
vertical epitaxial-base npn bipolar transistors in a first subset of the active bipolar transistor regions,
vertical epitaxial-base pnp bipolar transistors in a second subset of the active bipolar transistor regions,
collector contact regions which are respectively arranged adjoining an active bipolar transistor region, and
shallow field insulation regions which respectively laterally delimit the active bipolar transistor regions and the collector contact regions.

The invention further concerns a process for the production of such a complementary bipolar semiconductor device.

2. Discussion of Related Art

For reasons relating to circuitry engineering it is often advantageous to have complementary bipolar transistors and complementary metal oxide semiconductor (CMOS) transistors at the same time on a monolithic semiconductor chip. A technology which aims at the production of precisely that transistor range is referred to as complementary bipolar CMOS technology or CBiCMOS technology or process, while the combined production of only one type of bipolar transistor, usually an npn bipolar transistor, jointly with CMOS transistors, is referred to as BiCMOS technology or BiCMOS process.

Usually, bipolar transistors are used in CBiCMOS or BiCMOS chips, hereinafter also referred to as hybrid chips, in circuitry parts where their high-frequency efficiency which is better in many respects in comparison with CMOS transistors is useful. The CMOS transistors are often used in hybrid chips, as in pure CMOS chips, primarily in circuitry blocks which serve for digital signal processing.

Due to that typical allocation of tasks as between bipolar and CMOS transistors hybrid chips generally include incomparably more CMOS transistors (typically several millions) than bipolar transistors (typically some thousand to tens of thousands). Particularly because of that "unbalance", the usual practice in the development of BiCMOS and CBiCMOS technologies is to take as the basic starting point an existing basic CMOS process in which the technological steps for production of the bipolar components are subsequently integrated. In that respect in the ideal situation that integration process should involve the following features:

a) modular bipolar integration: so-called CMOS libraries, small "elementary circuits" of the basic CMOS process which can be effectively used for designing complex digital circuit blocks must also operate in the derived BiCMOS or CBiCMOS process. That requires bipolar integration not to alter the CMOS transistor properties in comparison with the basic process beyond a tolerable, generally extremely slight degree.
b) inexpensive bipolar integration: integration of the bipolar components should be effected in a way which adds as few additional process steps as possible, in particular also lithographic steps, to the basic CMOS process.
c) high-efficiency bipolar integration: bipolar transistors are to be available in a number of variants, generally characterized by various combinations of collector-emitter breakdown voltage, measured with open base terminal (BV-CEO) and maximum transit frequency (fT), in the BiCMOS or CBiCMOS process and in that respect should as far as possible have high-frequency properties which come very close to those which could be implemented in the best-case scenario in pure bipolar technology, that is to say in particular also without having regard to a) and b).

It is easy to imagine that reconciling to some extent feature c) with features a) and b) represents a very great challenge in the development of BiCMOS but in particular CBiCMOS technologies.

The high-frequency efficiency of silicon-based bipolar transistors (referred to as bipolar junction transistors or BJT) has been substantially improved in recent years by the use of a hetero-base layer produced by means of epitaxy. In that case the hetero-base layer comprises a mixture of silicon and germanium (SiGe), wherein the Ge component is often varied deliberately within the layer along its direction of growth. Transistors with such a base layer are referred to as SiGe-HBTs (or heterojunction bipolar transistors or HBT).

In addition a further impetus in terms of efficiency in relation to SiGe-HBTs has been initiated by the additional incorporation of carbon into the SiGe base layer and/or adjoining silicon regions. SiGe-HBTs with additional carbon incorporation are referred to hereinafter as SiGe:C-HBTs. Those developments firstly related primarily to npn transistors, while in recent times the high-frequency efficiency of pnp transistors could also be drastically improved with the same measures.

General design features, corresponding to the present day state of the art, in respect of complementary bipolar transistors and process steps in a CBiCMOS technology with npn SiGe-HBTs and pnp SiGe-HBTs are published in B. El-Kareh, S. Balster, W. Leitz, P. Steinman, H. Yasuda, M. Corsi, K. Dawoodi, C. Dimecker, P. Foglietti, A. Haesler, P. Menz, M. Ramin, T. Schamagl, M. Schiekofer, M. Schober, U. Schulz, L. Swanson, D. Tatman, M. Waitschull, J. W. Weijtmans and C. Willis: "A 5V complementary SiGe BiCMOS technology for high-speed precision analog circuits", BCTM, pages 211-214, 2003 (hereinafter referred to as El-Kareh et al.). The solution described therein aims at the lowest possible parasitic capacitances and a collector resistance which is as low as possible. Small collector-substrate capacitances are implemented by means of deep trenches filled with insulator material and with a buried silicon oxide layer using SOI technology ("silicon on insulator"). In addition the buried oxide layer in conjunction with the deep trenches ensures electrical insulation of the collectors in relation to the substrate. To keep the collector resistances low El-Kareh et al. use epitaxially buried, highly doped collector layers and special implantation steps for a low-ohmic connection of the buried collector layers, referred to as the "collector sinker".

With that CBiCMOS technology El-Kareh et al. reach limit frequencies fT (transit frequency)/fmax (maximum oscillation frequency) of 19/60 GHz for npn transistors and 19/45 GHz for pnp transistors.

A disadvantage with that process however is that typical modern CMOS technologies include neither epitaxially buried collector layers nor deep insulation trenches nor collector sinkers. The additional process complication and expenditure for the implementation of those structures is in part considerable. As the CMOS transistors are introduced into the epitaxy layer which is deposited over the collector layers buried thereby an additional heat stress in respect of the buried collector layers used by El-Kareh et al. is not to be avoided during the CMOS process. That reduces the profile gradient of the buried collector layers, whereby the efficiency of both types of bipolar transistors but in particular that of the pnp transistors in the high-speed range is adversely affected.

In addition the process described by El-Kareh et al. suffers from the disadvantage that process steps for CMOS and bipolar components are coupled in a way which impedes true modularity of bipolar integration. Thus that arrangement uses a gate electrode in the form of a layer stack which results from two deposition processes and not, as is usual in CMOS processes, a single polycrystalline silicon layer (polysilicon layer). In El-Kareh et al. the gate stack comprises a polysilicon layer and a p-doped polycrystalline SiGe-layer which is produced during deposition of the base of the npn bipolar transistors. That coupling pursues the aim of keeping down the process complication and expenditure and therewith the complexity and costs of the proposed CBiCMOS technology. The disadvantage of that process however is that the interchangeability of process modules, which is usually strived for, is hindered in that way.

As already mentioned hereinbefore the use of an SOI substrate in combination with deep trenches admittedly still affords the advantage of permitting electrical insulation of the bipolar transistors without further technological applications. In addition the collector-substrate capacitance can be kept comparatively low. SOI substrates however have in particular the disadvantage that dissipation of the heat produced in transistor operation is made considerably more difficult, in comparison with standard substrates. That disadvantage causes additional self-heating of the transistors under the operating conditions in the high-speed area and thus leads to a reduction in power potential.

In addition the silicon layers present in El-Kareh et al. on the buried oxide layer of the SOI substrate, in vertical extent, are too powerful to be able to produce optimized MOS transistors, for example so-called fully depleted MOS transistors, on an SOI substrate, without difficulties. Integration of the complementary bipolar transistors with a CMOS technology which was developed for standard substrates requires additional applications just because of the change to an SOI substrate.

Many of the discussed disadvantages of the CBiCMOS process described by El-Kareh et al. and the design features involved therein in respect of the complementary bipolar transistors are avoided in a CBiCMOS process with complementary SiGe:C-HBTs which has been described by B. Heinemann, R. Barth, D. Bolze, J. Drews, P. Formanek, O. Fursenko, M. Glante, K. Glowatzki, A. Gregor, U. Haak, W. Höppner, D. Knoll, R. Kurps, S. Marschmeyer, S. Orlowski, H. Rücker, P. Schley, D. Schmidt, R. Scholz, W. Winkler and Y. Yamamoto: "A complementary BICMOS technology for high-speed npn and pnp SiGe:C-HBTs", IEDM, pages 117-120, 2003 (hereinafter Heinemann et al.). Thus that CBiCMOS process uses standard substrates and does not require any deep trenches for low collector-substrate capacitances. Integration of the complementary bipolar transistors including collector implantation thereof is effected only after structuring of the standard CMOS gates, which permits truly modular bipolar integration. Heinemann et al., with that CBiCMOS technology, achieve limit frequencies fT/fmax of 180/185 GHz with a breakdown voltage BVCEO of 2V for npn transistors and 80/120 GHz at BVCEO of 2.6V for pnp transistors.

The excellent high-frequency properties of the complementary bipolar transistors of Heinemann et al., produced in a bipolar process implementation which can be modularly integrated without problems into a typical, highly scaled basic CMOS process, result substantially from two features, the use of a novel collector construction and the first use of an SiGe:C-base layer also for pnp transistors. Both features are briefly discussed hereinafter.

The novel collector construction which was described by Heinemann et al. and which is used both for npn and also pnp transistors (with suitable doping inversion) comprises a unitary active region, that is to say a region which is not interrupted by insulation trenches, which is delimited at the outer edge only by shallow silicon oxide-filled trenches. Such shallow trenches, unlike the above-discussed deep trenches, involve depths of markedly less than 1 μm, typically 0.5 μm. Shallow trenches are an ordinary constituent of any modern CMOS technology so that the use thereof in the bipolar module of a BiCMOS or CBiCMOS technology is possible without any additional complication and thus costs. The collector implant (or a succession of collector implants) is introduced into the unitary active region and healed in such a way that the np junction to the p substrate (for the npn transistor) and/or the pn junction to an implanted insulation layer (for the pnp transistor) is no deeper than the bottom of the shallow trenches which outwardly delimit the unitary active region. That initially ensures that low collector-substrate capacitances can be achieved even without the use of a complicated and expensive deep trench insulation.

As the so-called inner base of the transistor and thereover the emitter are formed above the unitary active collector region and then the emitter and the collector are contacted within the plan view onto the unitary collector region, it is also possible to achieve very low collector resistances without using epitaxially buried, highly doped collector layers and special collector sinkers.

The second main feature in the CBiCMOS technology described by Heinemann et al. involves the first use of an SiGe:C-base layer also for the pnp transistor and the introduction of a special n-doping profile during the base deposition process for that type of transistor. That avoids certain disadvantages of the Si/SiGe heterojunction for pnp transistors, see D. V. Singh, J. L. Hoyt, I. F. Gibbons: "Effect of band alignment and density of states on the collector current in p-Si/n-Si1-yCy/p-Si HBTs", IEDM, pages 749-752, 2000, and improved stability in relation to the diffusion of doping elements is achieved, similarly as in the npn case. That is of benefit to the high-frequency properties of the pnp transistors and in particular their "maintenance" within a CMOS environment with the healing processes which are usually involved there for the source/drain implants which can also act on the base doping profiles of the bipolar transistors in a BiCMOS or CBiCMOS process.

To sum up it can be considered that the CBiCMOS process by Heinemann et al. already has two of the above-mentioned features of an "ideal" integration of bipolar components, in particular complementary bipolar components, in a basic CMOS process, namely the features of "modular bipolar integration" and "high-efficiency bipolar integration". The third feature that it is striven to achieve, namely "inexpensive bipolar integration" is however still not really achieved in the Heinemann et al. CBiCMOS process. In comparison with the basic CMOS process 10 additional mask steps associated with bipolar integration are required.

The underlying technical problem of the invention is therefore that of providing a complementary bipolar semiconductor device of the kind set forth in the opening part of this specification, which is inexpensive to manufacture and in which both bipolar transistor types have very good properties for high-speed uses.

A further underlying technical problem of the invention is to provide an inexpensive process for the production of a bipolar semiconductor device, which makes it possible to produce both bipolar transistor types with very good properties for high-speed uses.

DISCLOSURE OF INVENTION

In accordance with a first aspect of the invention the technical problem is resolved by a complementary bipolar semiconductor device, hereinafter also referred to as a CBi semiconductor device, comprising
a substrate of a first conductivity type,
active bipolar transistor regions in the substrate, in which the base, emitter and collector of vertical bipolar transistors are arranged,
vertical epitaxial-base npn bipolar transistors in a first subset of the active bipolar transistor regions,
vertical epitaxial-base pnp bipolar transistors in a second subset of the active bipolar transistor regions,
collector contact regions which are respectively arranged adjoining an active bipolar transistor region, and
shallow field insulation regions which respectively laterally delimit the active bipolar transistor regions and the collector contact regions.

In the CBi semiconductor device according to the invention arranged between the first or the second or both the first and also the second subset of active bipolar transistor regions on the one hand and the adjoining collector contact regions on the other hand is a respective shallow field insulation region of a first type with a first depthwise extent in the direction of the substrate interior. Shallow field insulation regions of a second type of a second greater depthwise extent than the first depthwise extent delimit the active bipolar transistor regions and the collector contact regions viewed in cross-section at their sides facing away from each other.

In the CBi semiconductor device according to the invention at least one of the two bipolar transistor types includes shallow field insulation regions of the first type. The different shallow field insulation regions provide that two parameter which are important for the high-frequency properties, namely collector resistance and base-collector capacitance, are kept down at the same time. In that respect, not more than three up to at most five additional lithographic mask steps are required in comparison with the basic CMOS process for production of the device. That attains inexpensive bipolar integration.

Some terms used to describe the complementary bipolar semiconductor device are explained in greater detail hereinafter.

An active bipolar transistor region is a special case of an active region. The term active region is generally used to denote a semiconducting substrate region which extends in the cross-sectional profile between two adjacent field insulation regions and in which functional structure elements of the CBi semiconductor device are disposed. As an example to distinguish the two terms "active bipolar transistor region" and "active region", attention is to be directed to the example of the collector contact region of the CBi semiconductor device according to the invention. That region is an active region but not an active bipolar transistor region because it does not include base, emitter and collector of the bipolar transistor in question.

Embodiments by way of example of the CBi semiconductor device according to the invention are described hereinafter.

The term shallow field insulation region which is usual in CMOS technology is to be interpreted in an embodiment as an insulation region in trench form, which terminates at least approximately flush with the substrate surface and which involves a depthwise extent of typically between 300 and 600 nm in the direction of the substrate interior. Shallow field insulation regions are typically produced with what is referred to as shallow trench technology, since the introduction of the 0.25 um CMOS technology. The trenches of the shallow field insulation regions can usually be filled with silicon dioxide or with a combination of a plurality of insulator materials. The shallow field insulation regions of the first type preferably involve a depthwise extent of between 50 and 200 nm in the direction of the substrate interior. Particularly good properties for the CBi semiconductor device were achieved with depthwise extents of between 70 and 150 nm.

In an embodiment the pnp bipolar transistors and the npn bipolar transistors have outer base regions which differ only in their conductivity type but not, apart from their conductivity doping, in their material composition and thickness. The reference to outer base region is used to denote the region which connects the so-called inner base disposed in the active bipolar transistor region to the base contact or contacts. The term base contact is used to denote a metal-filled hole in each insulation layer, which separates the outer base region from metal strips arranged thereover. Those metal strips serve for connecting the CBi semiconductor device into an integrated circuit. Similar explanations also apply in relation to the emitter and collector contacts.

In another embodiment the CBi semiconductor device additionally includes CMOS transistors. The outer base regions are formed from the same material layer from which gates of the CMOS transistors are formed.

In a further embodiment the CBi semiconductor device has npn and pnp bipolar transistors with an emitter in an emitter window. The emitter has emitter regions which project beyond the emitter window by a length amount laterally and in directions perpendicularly to an edge of the emitter window. That region is identified as the emitter window, where a highly doped emitter layer (typically with a doping of more than $1\times10^{19}$ cm$^{-3}$) has contact with the subjacent parts of the active bipolar transistor region. The emitter window is laterally surrounded by insulating material.

The length amount by which the emitter regions project beyond the emitter window is preferably equal in relation to each point of the window edge. In the case of the npn bipolar transistors in different embodiments the emitter regions can project beyond the emitter window by either the same length amount or by a different length amount from the case with the pnp bipolar transistors. The length amount preferably involves a respectively value of between 30 and 80 nm in the npn bipolar transistors and the pnp bipolar transistors.

In a further embodiment an insulation doping region is arranged between the collector and the substrate exclusively in that type of bipolar transistor in which the conductivity type of the substrate is the same as that of the collector region, the insulation doping region being adapted to electrically insulate the collector and the substrate from each other.

In accordance with a second aspect of the invention there is provided a process for the production of a CBi semiconductor device. The process comprises the steps:
providing a substrate of a first conductivity type;
producing active bipolar transistor regions in the substrate for the later production of base, emitter and collector of vertical bipolar transistors therein;
producing collector contact regions which are respectively arranged in adjoining relationship with an active bipolar transistor region;
producing shallow field insulation regions which respectively laterally delimit the active bipolar transistor regions and the collector contact regions;
producing vertical epitaxial-base npn bipolar transistors in a first subset of the active bipolar transistor regions; and
producing vertical epitaxial-base pnp bipolar transistors in a second subset of the active bipolar transistor regions.

The production of the shallow field insulation regions includes the production of a respective shallow field insulation region of a first type with a first depthwise extent in the direction of the substrate interior between the first or the second or both the first and the second subset of active bipolar transistor regions on the one hand and the adjoining collector contact regions on the other hand. The production of the shallow field insulation regions includes the production of shallow field insulation regions of a second type with a second greater depthwise extent than the first depthwise extent, which delimit the active bipolar transistor regions and the collector contact regions viewed in cross-section at their sides facing away from each other.

The production process in the second aspect of the invention shares the above-described advantages of the CBi semiconductor device of the first aspect of the invention.

It is noted that the sequence of steps used hereinbefore to describe the process according to the invention does not have to correspond to the sequence in which the steps are performed. For example in an embodiment production of the shallow field insulation regions is effected prior to the production of the active bipolar transistor regions and the collector contact regions.

It is further noted that the production of active bipolar transistor regions in the substrate for the later production of base, emitter and collector of vertical bipolar transistors therein involves the lateral arrangement of base, emitter and collector relative to the respective bipolar transistor region. The step is not to be interpreted for example such that the base or the emitter were to be arranged in the substrate interior.

Described hereinafter are embodiments by way of example of the process according to the invention, in which production of the pnp bipolar transistors and the npn bipolar transistors includes the production of outer base regions which differ only in their conductivity type but not, apart from their conductivity doping, in their material composition and thickness.

In an embodiment CMOS transistors are additionally produced. In this embodiment outer base regions of the bipolar transistors are formed from the same material layer from which gates of the CMOS transistors are formed.

In another embodiment an insulation doping region is produced between the collector and the substrate exclusively in that type of bipolar transistor in which the conductivity type of the substrate is the same as that of the collector region, the insulation doping region being adapted to electrically insulate the collector and the substrate from each other.

As also described in connection with the device aspect of the invention the shallow field insulation regions of the second type are preferably produced with a depthwise extent of between 300 and 600 nm in the direction of the substrate interior. In contrast the shallow field insulation regions of the first type are preferably produced with a depthwise extent of between 50 and 200 nm, in particular between 70 and 150 nm, in the direction of the substrate interior.

BRIEF DESCRIPTION OF THE DRAWINGS

The features and advantages of the CBi semiconductor device according to the invention and the production process according to the invention are described in greater detail hereinafter by means of further embodiments with reference to the Figures in which:

FIGS. 3a through 19 show diagrammatic cross-sectional views of various production phases for the CBi semiconductor device of FIGS. 1 and 2 to illustrate an embodiment of a production process.

DETAILED DESCRIPTION

Figure 1:
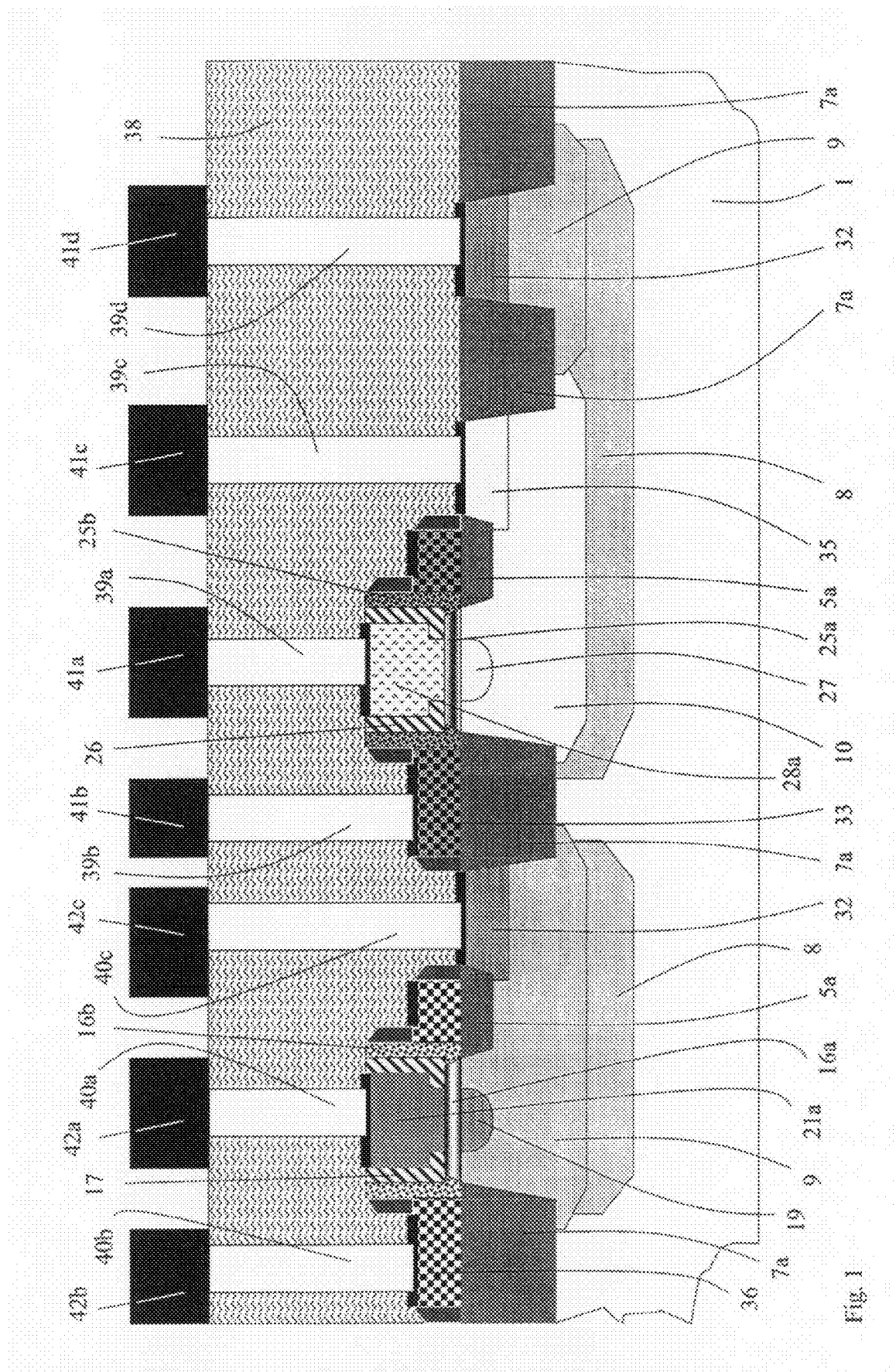
FIGS. 1 and 2 show diagrammatic cross-sectional views of an embodiment of a CBi semiconductor device in two different stages of production.
Figure 2:
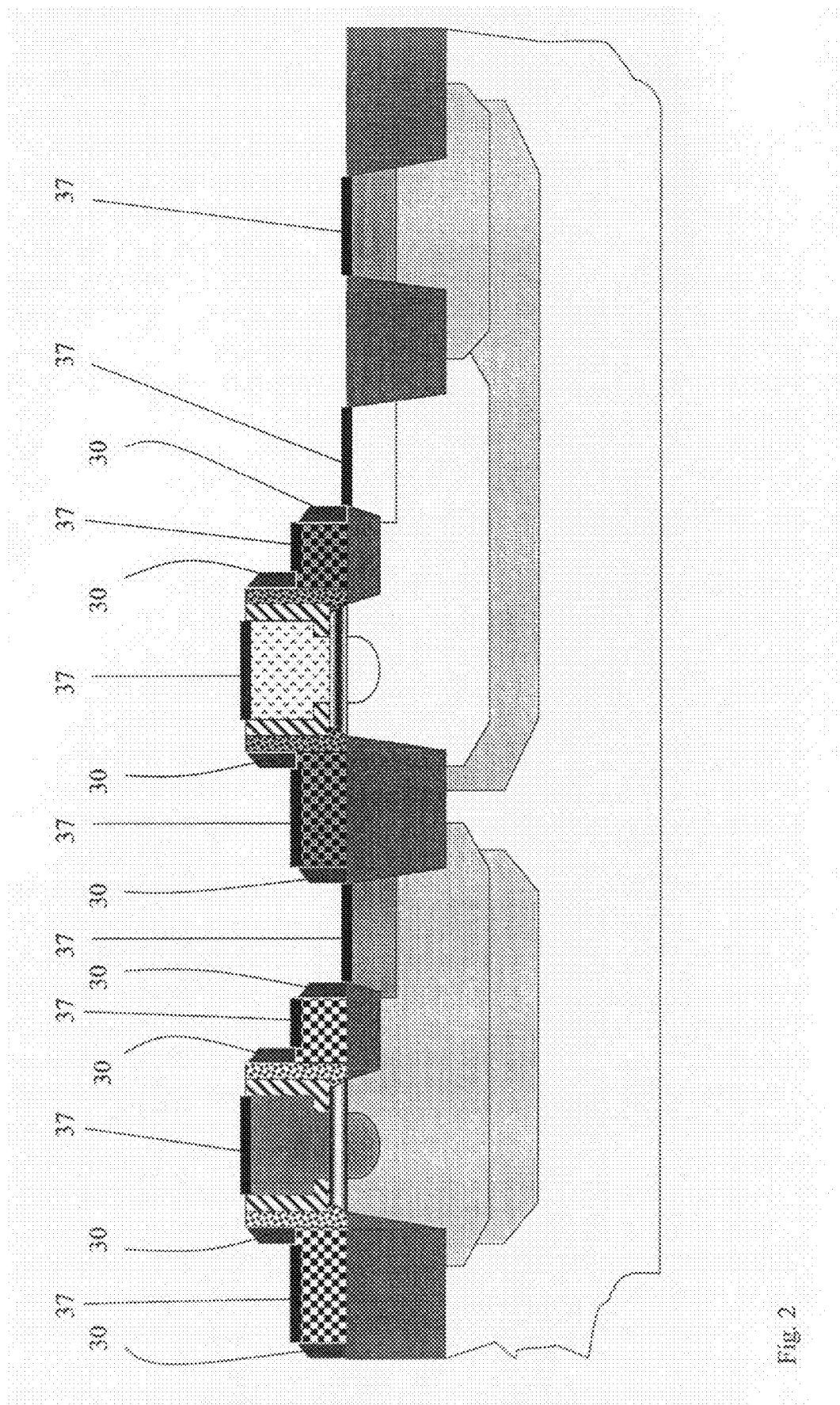

FIGS. 1 and 2 are diagrammatic cross-sectional views showing an embodiment by way of example of a CBi semiconductor device, illustrating two conditions of the device at different stages in its production procedure. FIG. 1 shows the device after structuring of a first metal layer has been effected while FIG. 2 shows a previous state in the production procedure, after siliconizing all silicon regions not covered with insulator material.

An embodiment of the CBi semiconductor device according to the invention will firstly be described with reference to FIGS. 1 and 2.

Disposed in a substrate 1 as is usually employed in silicon technology and which in the illustrated case is to be p-conducting are shallow trenches filled with insulator material, of differing depth. The trenches 7a are of a depth as is usually employed in CMOS technology (typically 300-600 nm). The trenches 7a laterally delimit on the one hand the active regions of the npn transistor which include the n-conducting regions 8, 9 and 32 and on the other hand the active regions of the pnp transistor which include the p-conducting regions 10 and 35. Insulation of the pnp transistor in relation to the p-conducting substrate is effected by the n-conducting regions 8 and 9 which are disposed beneath or laterally of the region 10. The regions 8 and 9 jointly with the n-conducting region 19 form the collector of the npn transistor while the region 10 jointly with the p-conducting region 27 forms the collector of the pnp transistor.

A feature of the present embodiment of the device according to the invention are the shallow trenches 5a filled with the same insulator material as the trenches 7a. Both in the npn and the pnp transistor they laterally separate the active bipolar transistor region from the respective collector contact regions (region 32 for the npn transistor and region 35 for the pnp transistor). The depth of the trenches 5a should be in the range of between 50 and 200 nm, optimally at 70-150 nm. Those trenches provide that two parameters important for high-frequency properties, collector resistance and base-collector capacitance, are kept down at the same time. It is to be noted that at least one of the two bipolar transistor types should include a trench 5a.

The p-conducting inner base of the npn transistors, which is a constituent part of the region 16a, is above the n-conducting regions 9 and 19. It is laterally connected by way of the also p-conducting layers 16b and 36 to a silicide layer 37 (see FIG. 2). Disposed above the region 16a of the npn transistor is a highly n-doped region 21a forming the emitter of the npn transistor. That region is insulated from the p-conducting region 16b by L-shaped spacers 17 comprising insulating material. The edges of those spacers on the surface of the region 16a form the emitter window of the npn transistor. In the preferred embodiment the amount with which the region 21a projects laterally beyond the emitter window is always the same on all sides perpendicularly to the window edge. A silicide layer 37 is again disposed on the emitter region 16a.

The n-conducting inner base of the pnp transistors, which is a constituent part of the region 25a, is above the n-conducting regions 10 and 27. It is laterally connected by way of the also n-conducting layers 25b and 33 to a silicide layer 37. Disposed above the region 25a of the pnp transistor is a highly p-doped region 28a forming the emitter of the pnp transistor. That region is insulated from the n-conducting region 25b by L-shaped spacers 26 of insulating material. The edges of those spacers on the surface of the region 25a form the emitter window of the pnp transistor. In the present embodiment the amount by which the region 28a projects laterally beyond the emitter window is always the same on all sides perpendicularly to the window edge. It can however differ from the corresponding amount of the npn transistor. Typical values for that amount are in the range of between 30 and 80 nm both for the npn and also the pnp transistors. A silicide layer 37 is again disposed above the emitter region 28a.

In the present embodiment the regions 33 of the pnp transistor and 36 of the npn transistor which are essential parts of the outer base regions of the respective transistors differ for both types of bipolar transistor only in respect of the conductivity type but not in composition and thickness.

The emitter, base, collector and insulating layer 8 of the pnp transistor are connected by way of the contacts 39a-39d which lead through an insulator layer 38 to the strips 41a-41d of a first metal layer, by means of which the transistors can be connected into integrated circuits. The structures 40a-40b and 42a-42b are the corresponding contacts or metal strips for the emitter, base and collector of the npn transistor.

Further structures of the device are the spacers 30 (FIG. 2) which comprise insulator material or a combination of various insulator materials and which are formed during the device production process.

A production process for a CBi semiconductor device according to the invention in a CBiCMOS process is described hereinafter with reference to FIGS. 3a-19.

In this case not more than three to a maximum of five additional lithographic mask steps are required in comparison with the basic CMOS process for the production of the device, whereby in particular the feature of inexpensive bipolar integration is achieved.

Figure 3A:
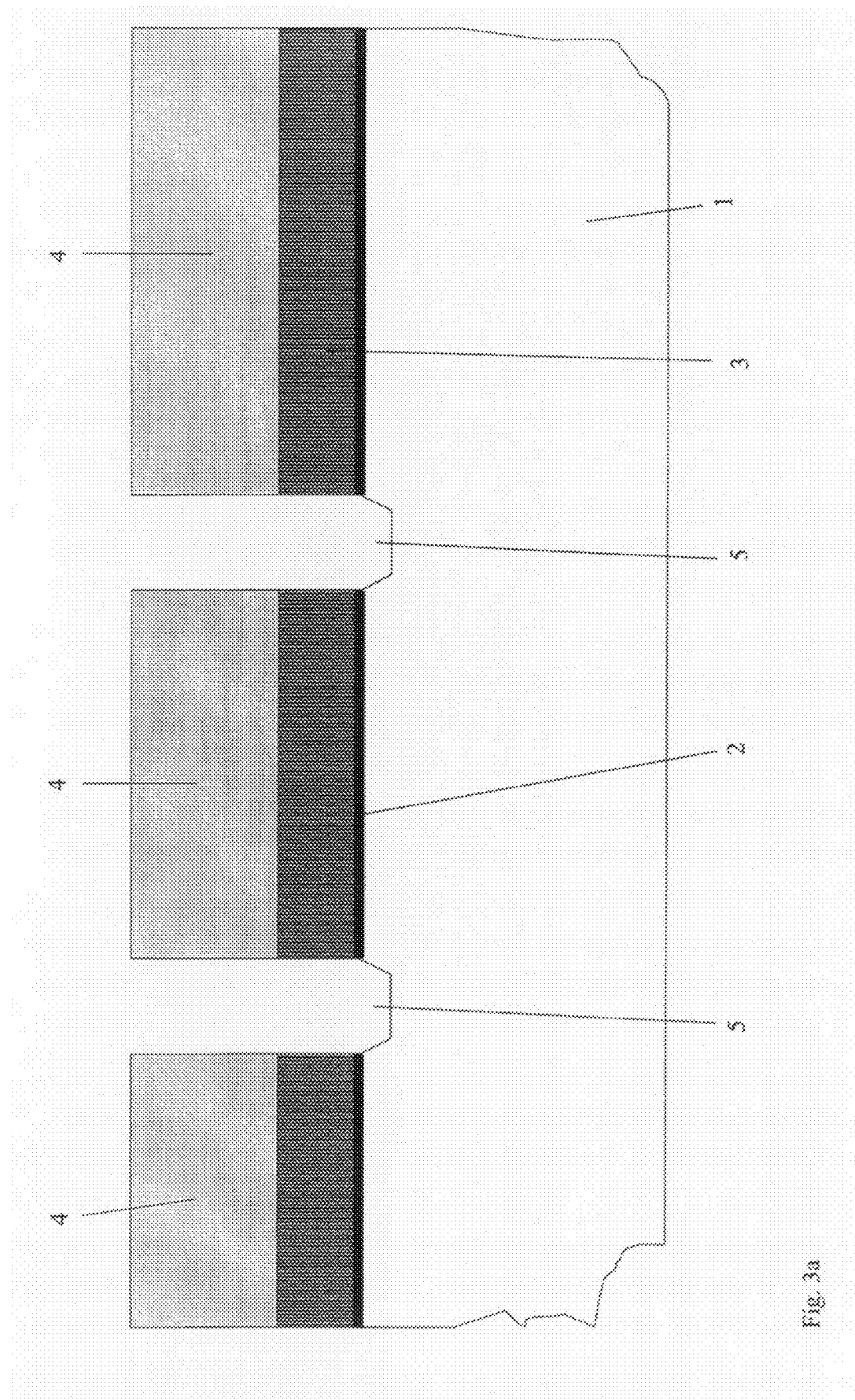
Figure 3B:
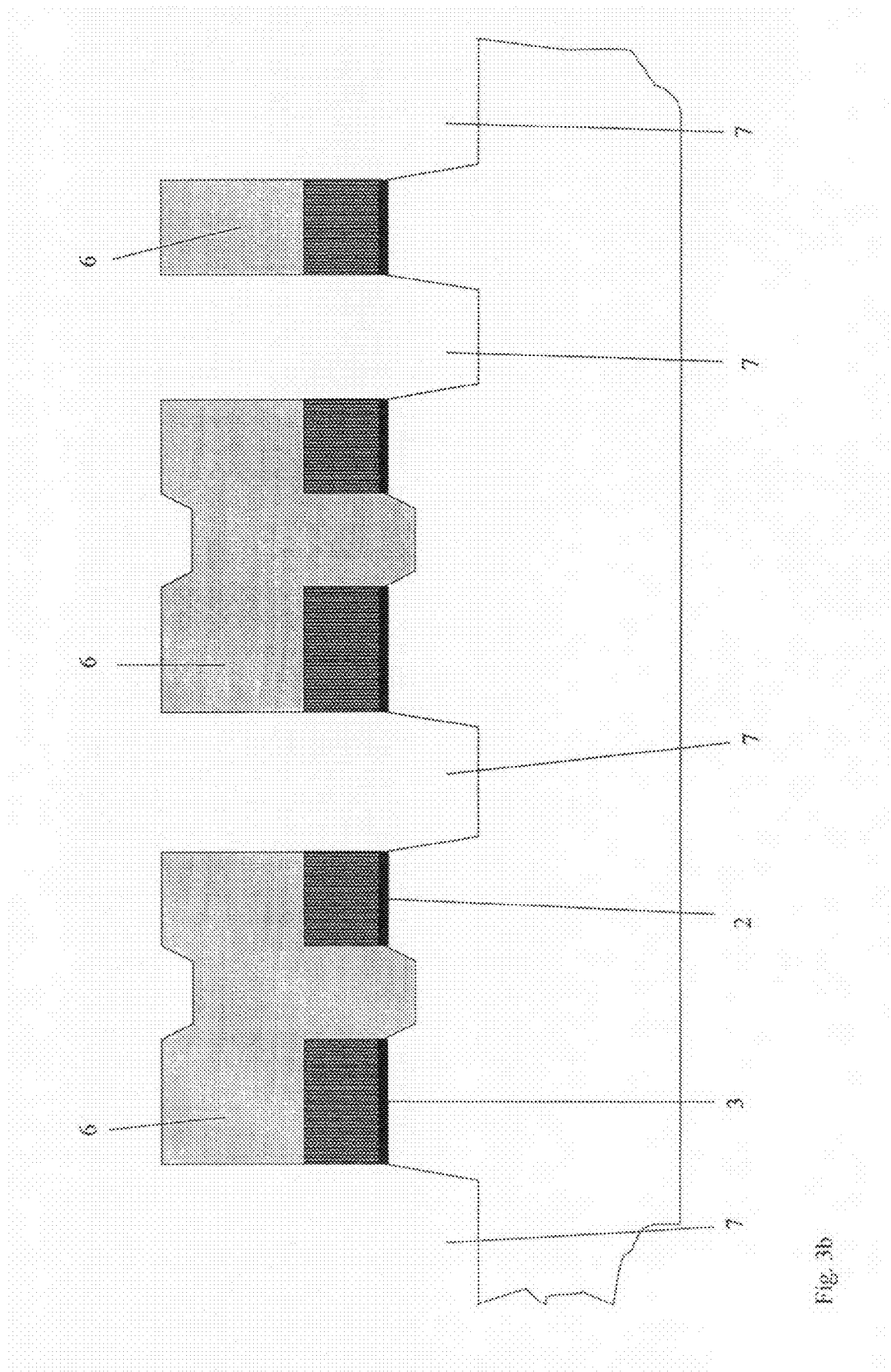

FIGS. 3a-3c illustrate the production of the insulating trenches of the CBi semiconductor device. A layer combination of typically $SiO_2$ (layer 2) and $Si_3N_4$ (layer 3) is structured by means of a first lacquer mask 4 produced by means of photolithography, using a suitable RIE step (reactive ion etching). That is then again followed by etching by means of RIE of the shallow trenches 5 in the substrate 1, at a depth, calculated from the surface of the substrate 1, of about 50-200 nm, optimally 70-150 nm. After removal of the lacquer mask 4 and production of a second lacquer mask 6 etching of the deeper trenches 7 is effected (FIG. 3b). That process sequence is also a constituent part of the basic CMOS process so that only the production of the lacquer mask 4 must be deemed to be an additional lithographic procedure, in comparison with the basic CMOS process. After removal of the lacquer mask 6 the steps typically applied in the basic CMOS process for trench filling with insulator material (typically $SiO_2$) and planarisation thereof by means of CMP (chemical mechanical polishing) are effected. The remains of the layer 3 are then removed by wet-chemical etching. FIG. 3c illustrates the condition of the CBi semiconductor device at that point.

Then, possibly after the layer 2 has been etched away and the production of a fresh $SiO_2$ layer 2a, implantation of the regions 8-10 is effected by means of suitable lacquer masks. The same implantation conditions (species, energy and dose) are used for the regions 8-10, as are usually employed in the basic CMOS process for the production of the wells of NMOS and PMOS transistors and insulated NMOS transistors. In that way it is possible to produce the collector regions of the CBi semiconductor device without any additional step, compared to the basic CMOS process.

Figure 4A:
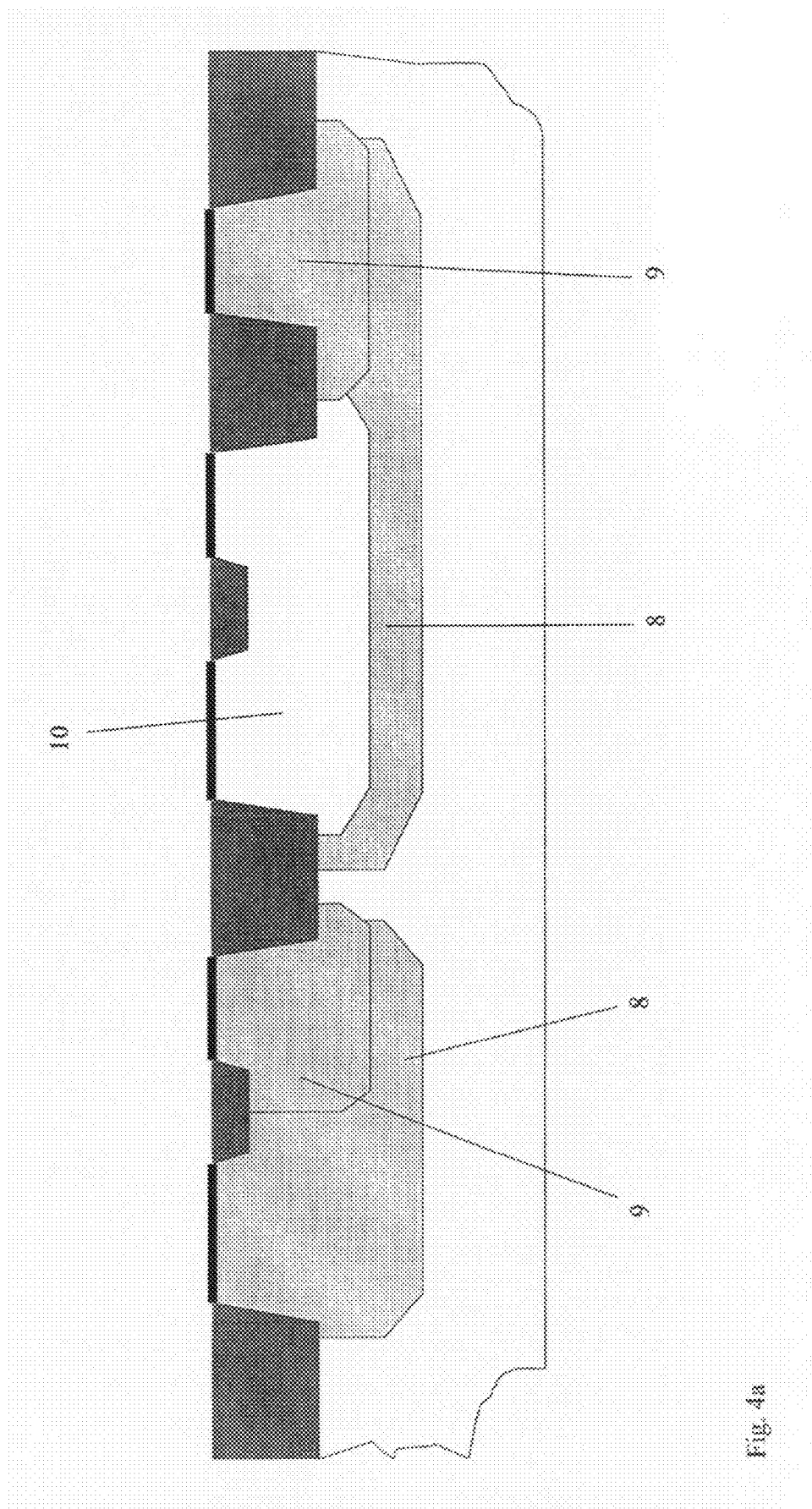

FIGS. 4a and 4b illustrate how various collector variants for the npn transistors are made possible just by an altered layout of the regions 8 and 9, without any additional complication and expenditure, compared to the FIG. 4 variant. In that way various types of npn transistors can be simultaneously produced on a chip, which differ in the base-collector breakdown voltage in the case of an open emitter (BVCBO) and the collector-emitter breakdown voltage in the case of an open case (BVCEO), which substantially enlarges the areas of use of the CBi semiconductor device.

Figure 4C:
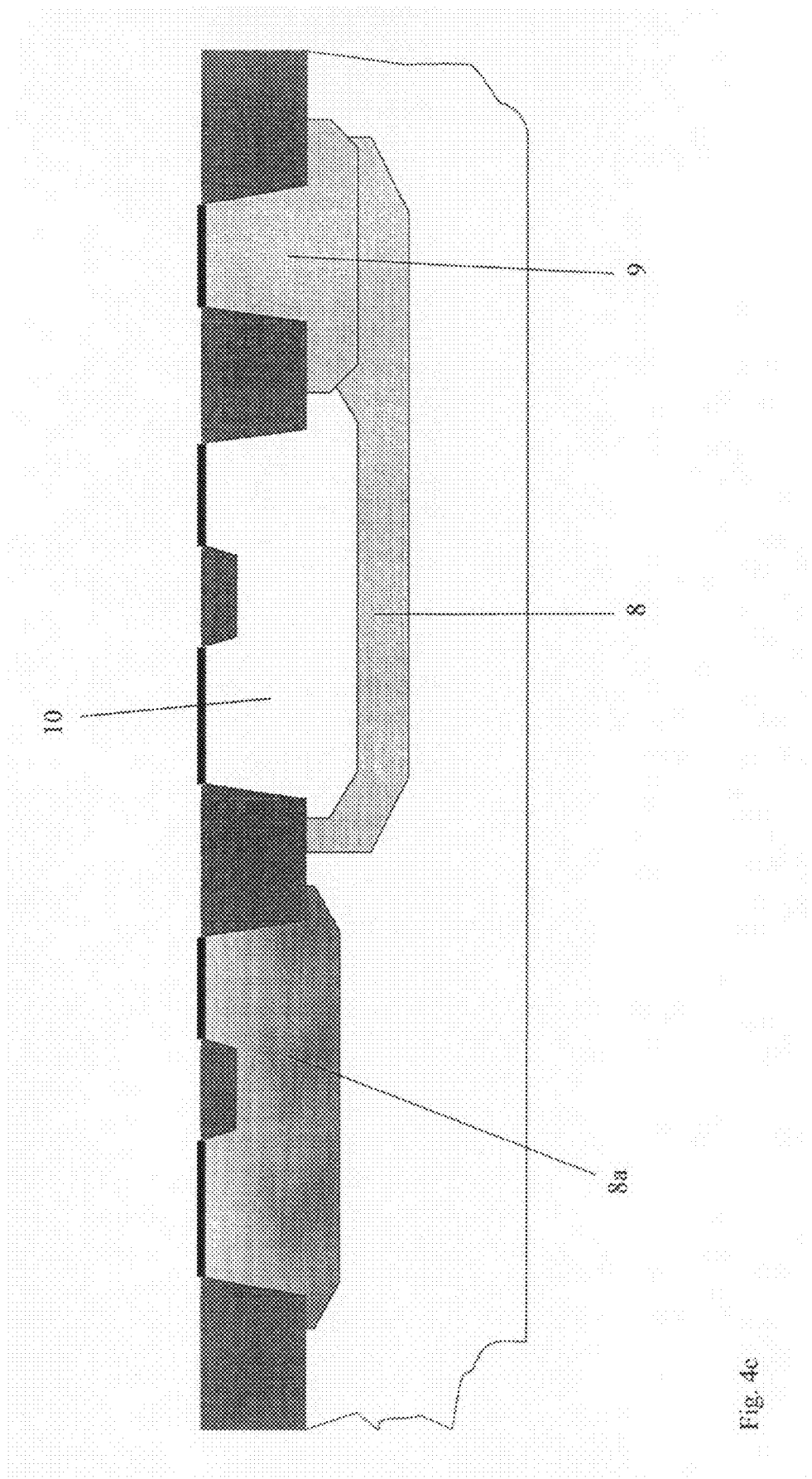

FIG. 4c shows that, with an additional lithographic step, compared to the basic CMOS process, the production of a further collector variant 8a is possible. That can then be optimized independently of the basic CMOS process and thus freely in respect of implantation conditions.

A further additional lithographic step affords a similar outcome for the pnp transistor (FIG. 4d), wherein that step makes it possible to decouple not just the conditions for collector implantation for the region 10a and also the implantation conditions for the insulation region 8b, from those of the well production of the basic CMOS process, and thus to make them freely optimizable. The two additional masks make it possible in particular to produce npn and also pnp transistors having improved high-frequency properties compared to the transistors with a collector structure as shown in FIGS. 4, 4a and 4b.

After removal of the layers 2 or 2a, production of the gate insulator 11 and deposition of an amorphous or polycrystalline layer of silicon 12, referred hereinafter as the polysilicon layer, as shown in FIG. 5, are now effected in the CBiCMOS process. Laterally separated parts of that layer at the end of the production process form both the gates of the MOS transistors but also essential parts of the outer base regions of the bipolar transistors. An insulator layer 13, preferably of $Si_3N_4$, is disposed above the layer 12.

Figure 6:
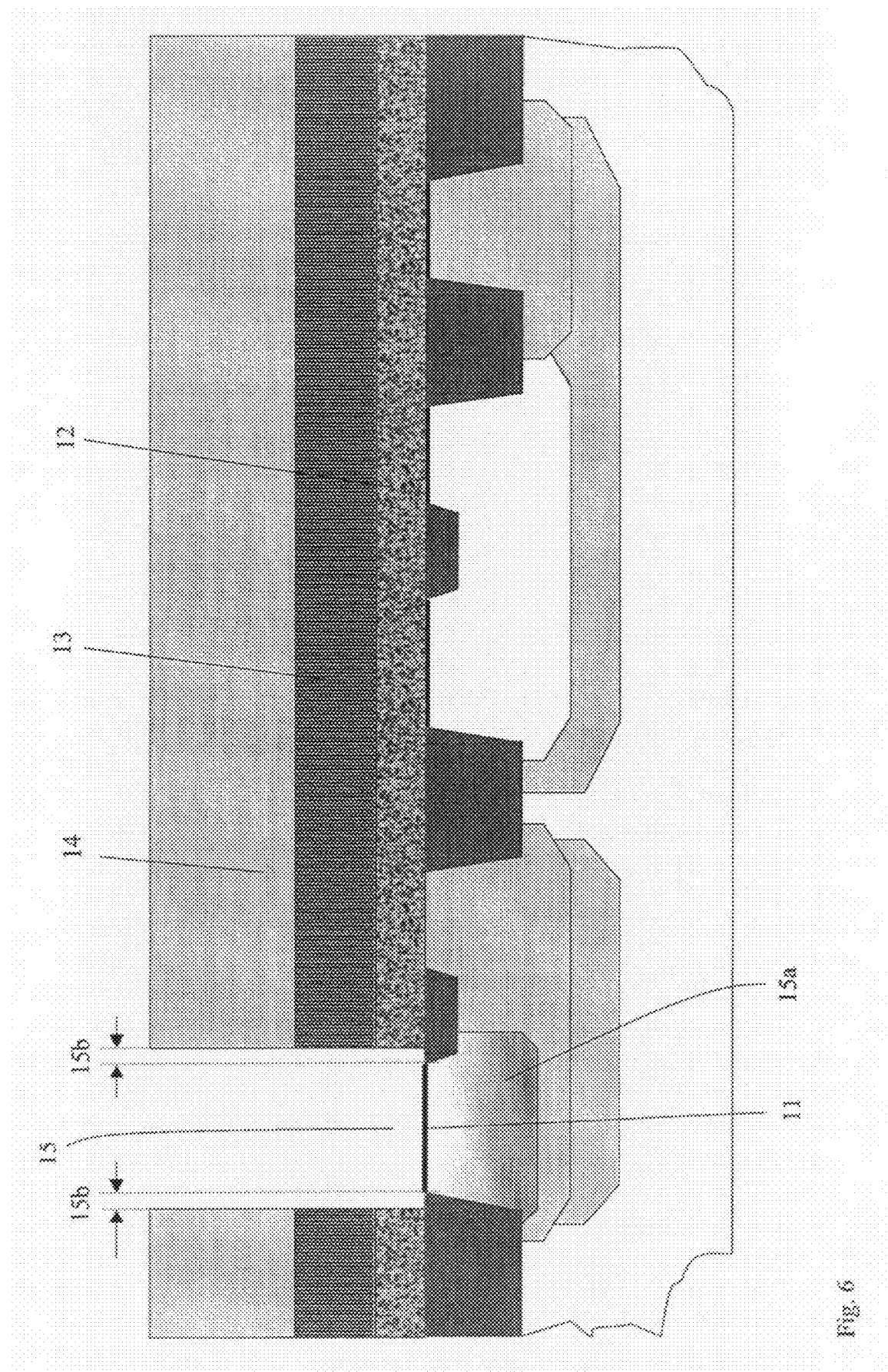
Figure 6A:
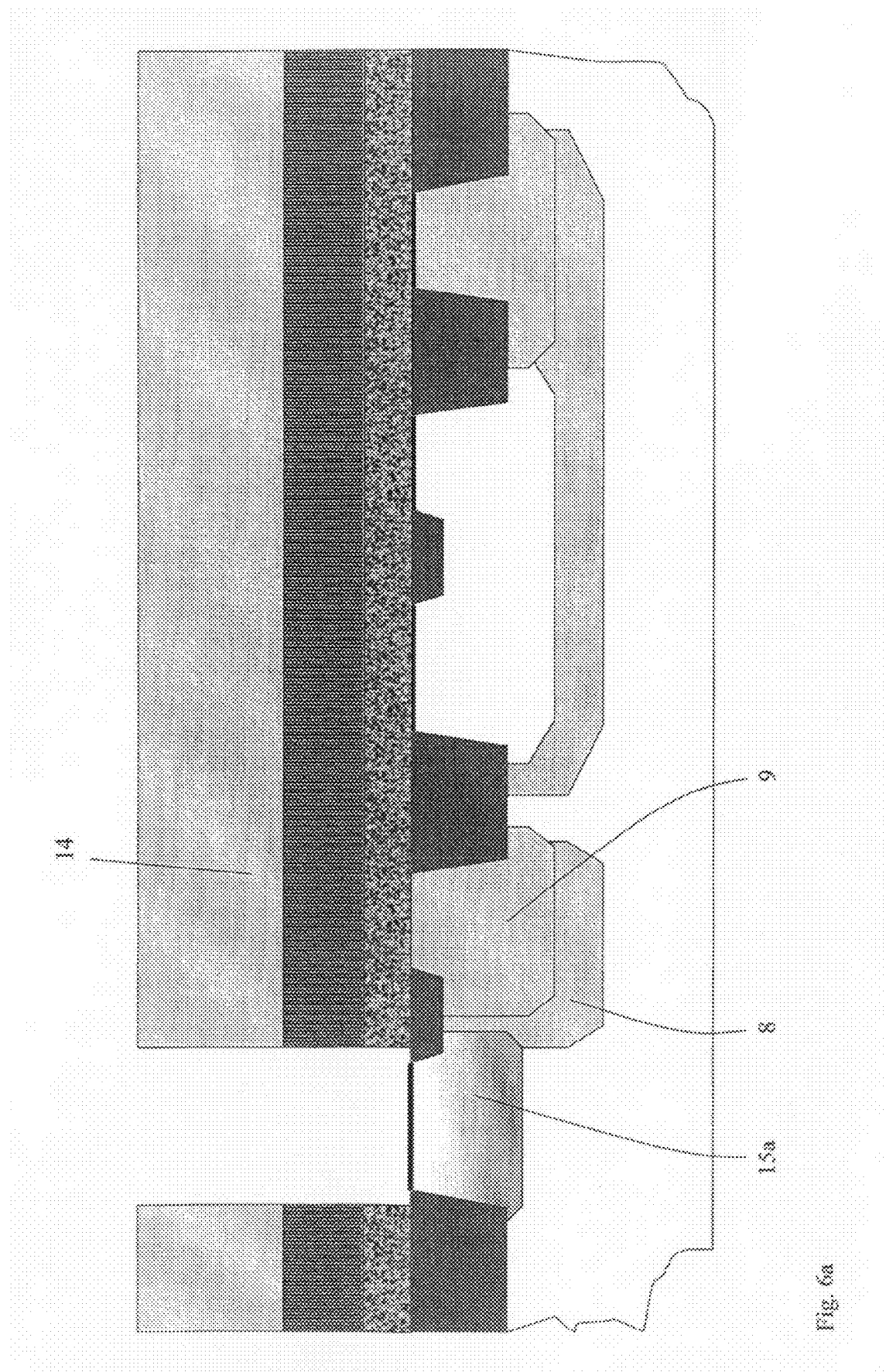

With a further additional lithographic step, in comparison with the basic CMOS process, the lacquer mask 14 is then produced, which serves for etching (by means of RIE) of a hole 15 in the layers 12 and 13, without substantially weakening the layer 11 (FIG. 6). In addition further implants 15a can be introduced through that hole, which allow further optimization of the various collector variants of the npn transistors, as shown for example in FIG. 6a. A distance which is important for the high-frequency properties is the overlap 15b of the hole 15 beyond the insulating regions 7a and 5a (see FIG. 6). That overlap should be not more than 50 nm.

FIGS. 7-10 illustrate how now the base and the emitter of the npn transistors are produced within the hole 15. Firstly, after wet-chemical removal of the layer 11, an epitaxy step is performed to form the monocrystalline layer stack 16a. Typically the layer stack 16a comprises a sequence of Si-, SiGeand again Si-layers of thicknesses, composition and doping profiles as are usually employed for the production of modern npn transistors for high-frequency uses. The incorporation of carbon into the SiGe-layer and/or adjoining Si-regions is also advantageous. The SiGe-layer embedded in the layer stack 16a is p-doped and forms the inner base of the npn transistor. In the FIG. 7 variant the epitaxy step for production of the layer stack 16a is carried out under a procedure which at the same time leads to the deposition of a layer 16b at the side wall of the hole 15 and on the surface of the layer 13. In that case the layer 16b does not differ in composition from the layer stack 16a and differs only slightly or not at all in thickness, but is polycrystalline.

Figure 7A:
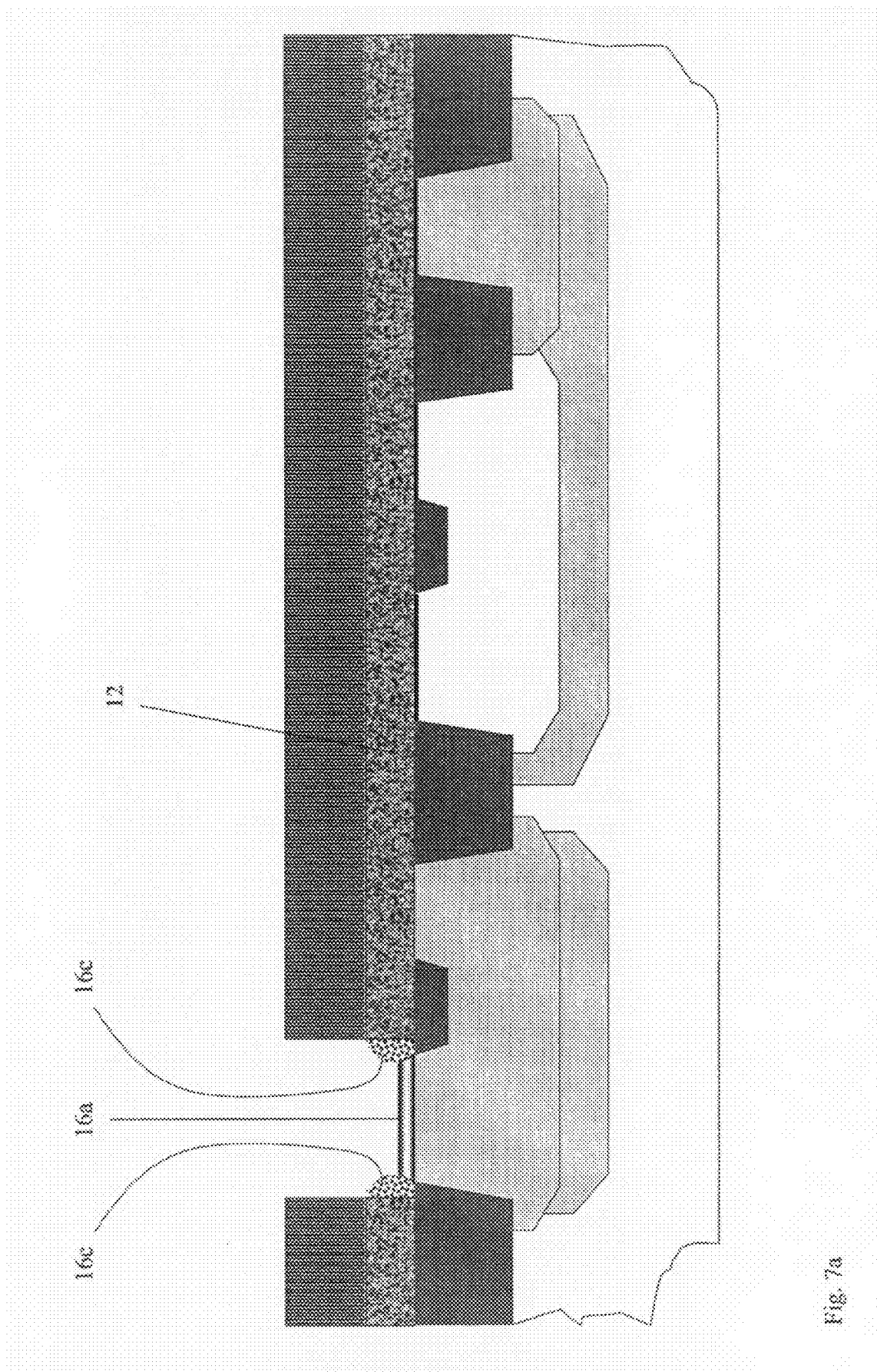

FIG. 7a shows a second variant of the epitaxy step for production of the layer stack 16a. This variant involves selecting a regime which at the same time leads to deposition of a layer 16c, wherein the layer 16c is formed only at the walls of the polysilicon layer 12, that are exposed in the hole 15. In this case the layer 16c does not differ in composition from the layer stack 16a and only slightly or not at all in thickness, but is polycrystalline.

FIG. 8 illustrates the production of the L-shaped spacers 17 comprising insulator material, preferably $SiO_2$. An $SiO_2$ layer is firstly deposited, followed by an $Si_3N_4$ layer or a layer of n-doped silicon. Suitable thicknesses for those layers are in the range of 50-120 nm for $SiO_2$, and 100-200 nm for both $SiO_3N_4$ and silicon. Back-etching of the $Si_3N_4$ or silicide layers is then effected by means of RIE, with the spacer 18 being formed. A further RIE step then serves for partial removal of the $SiO_2$ layer at the bottom of the hole and on the surface of the layer 16b (or the layer 13 if the epitaxy variant of FIG. 7a was used). At that point in the production process it is possible to effect mask-less implantation leading to the formation of the n-conducting region 19, in completely self-adjusted relationship with the emitter window. That structure, usually referred to as selectively implanted collector (abbreviated as SiC) permits further optimization of the collector variants of the npn transistors. The final structure shown in FIG. 8 is afforded by wet-chemical removal of the residues of the $SiO_2$ layer. That operating procedure ensures an advantageous feature of the CBi semiconductor device, namely that the amount 20 by which the emitter projects beyond the emitter window is always the same on all sides perpendicularly to the window edge. That is illustrated in the enlarged part of FIG. 8.

FIGS. 9 and 10 now demonstrate the production of the emitter of the npn transistors. Firstly, the procedure involves the deposition of a highly n-doped silicon layer 21 on the surface of the layer 16b (or the layer 13 if the epitaxy variant of FIG. 7a was used) and within the spacered hole 15. Prior to deposition of the layer 21 the spacer 18, if it consists of $Si_3N_4$, can also be removed by a wet-chemical step. That is then followed by complete isotropic removal of the layers 21 and 16b from the surface of the layer 13 and partial removal of the layer 13 itself. Suitable processes for that purpose are preferably CMP or isotropic RIE. FIG. 10 illustrates that that results in an emitter region 21a which is laterally insulated from the layer 16b by the spacer 17 and laterally projects beyond the emitter window by the amount 20, which facilitates later contacting of the emitter in the case of very small emitter windows.

Figure 11:
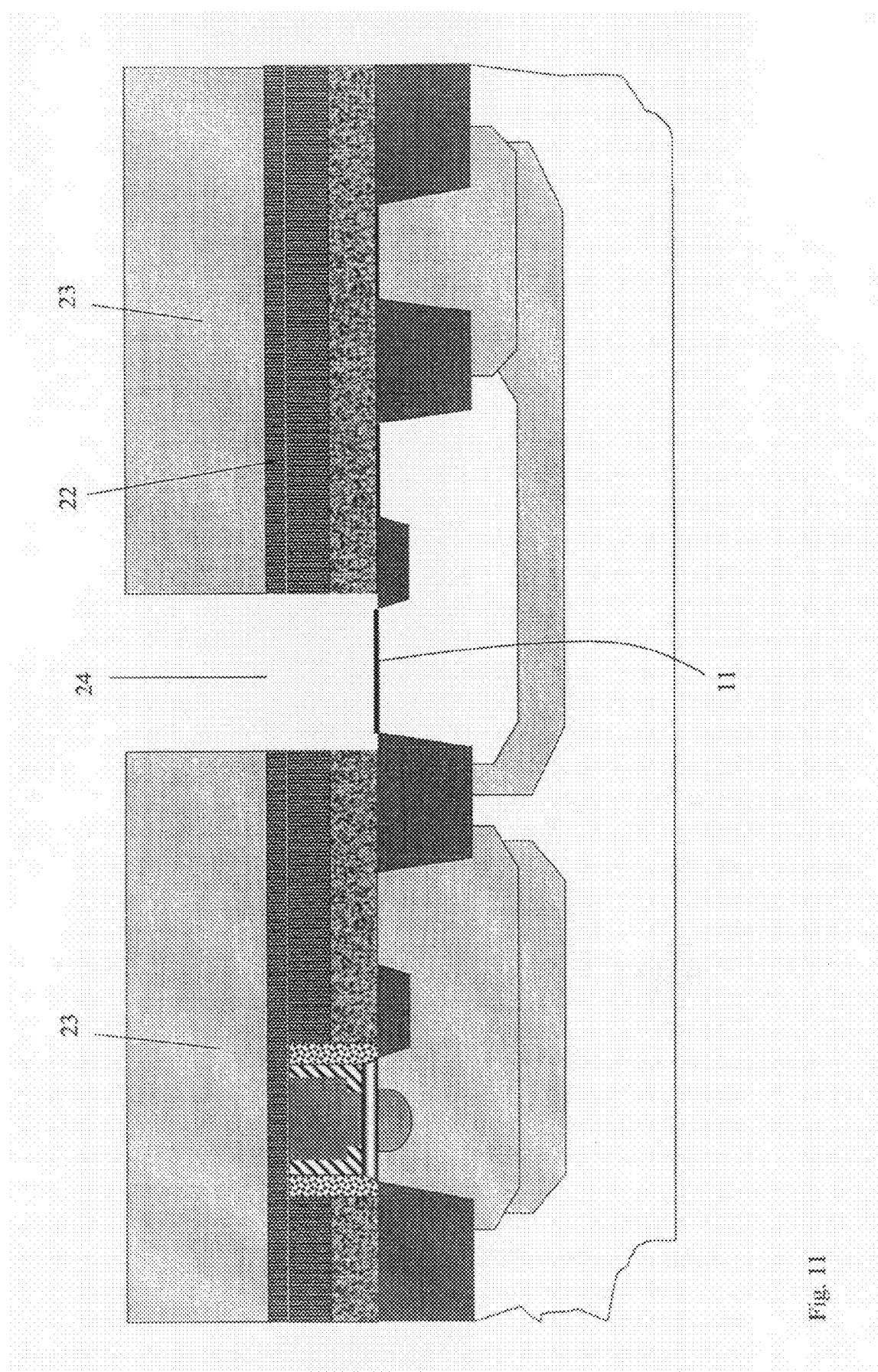
Figure 12:
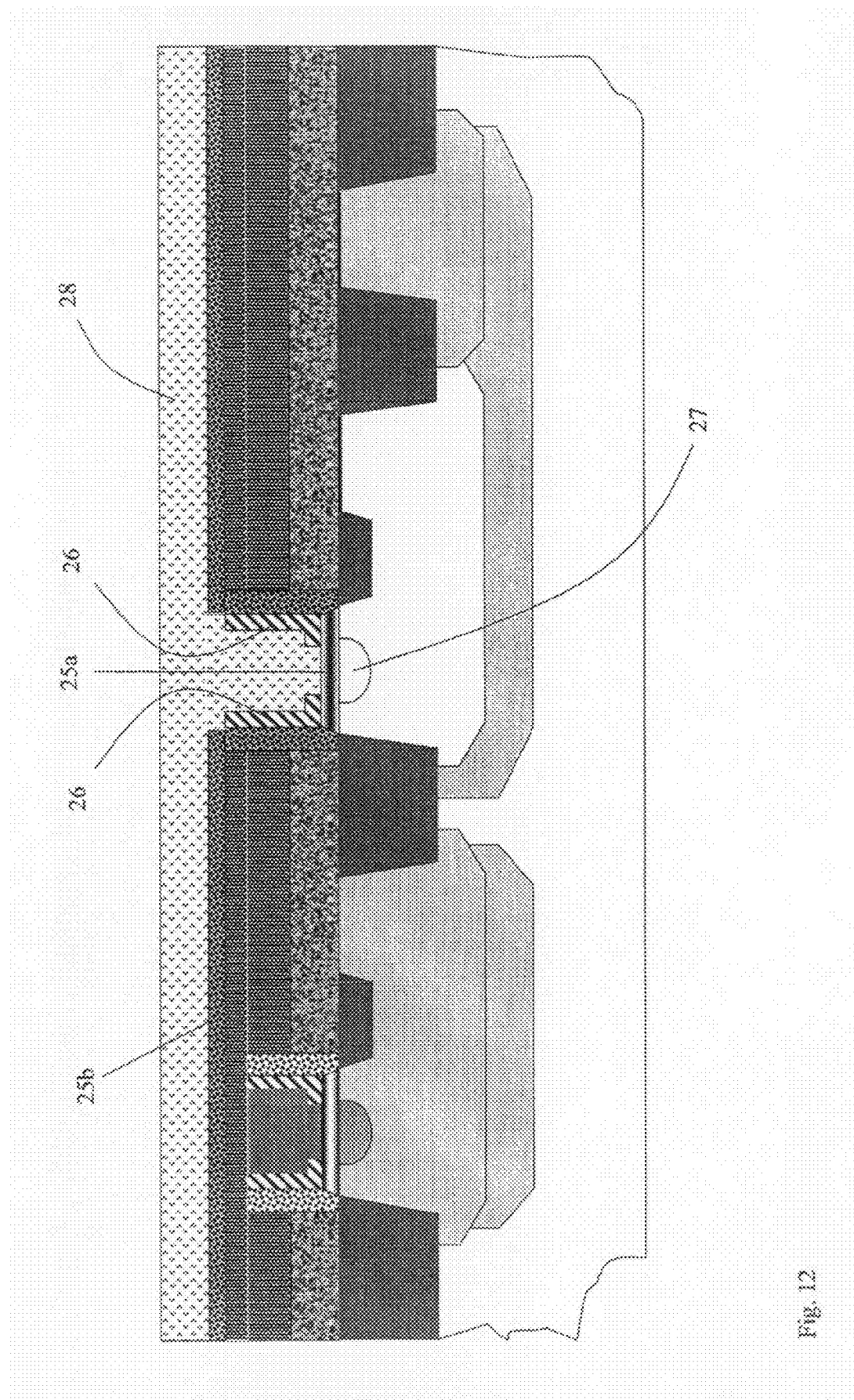
Figure 13:
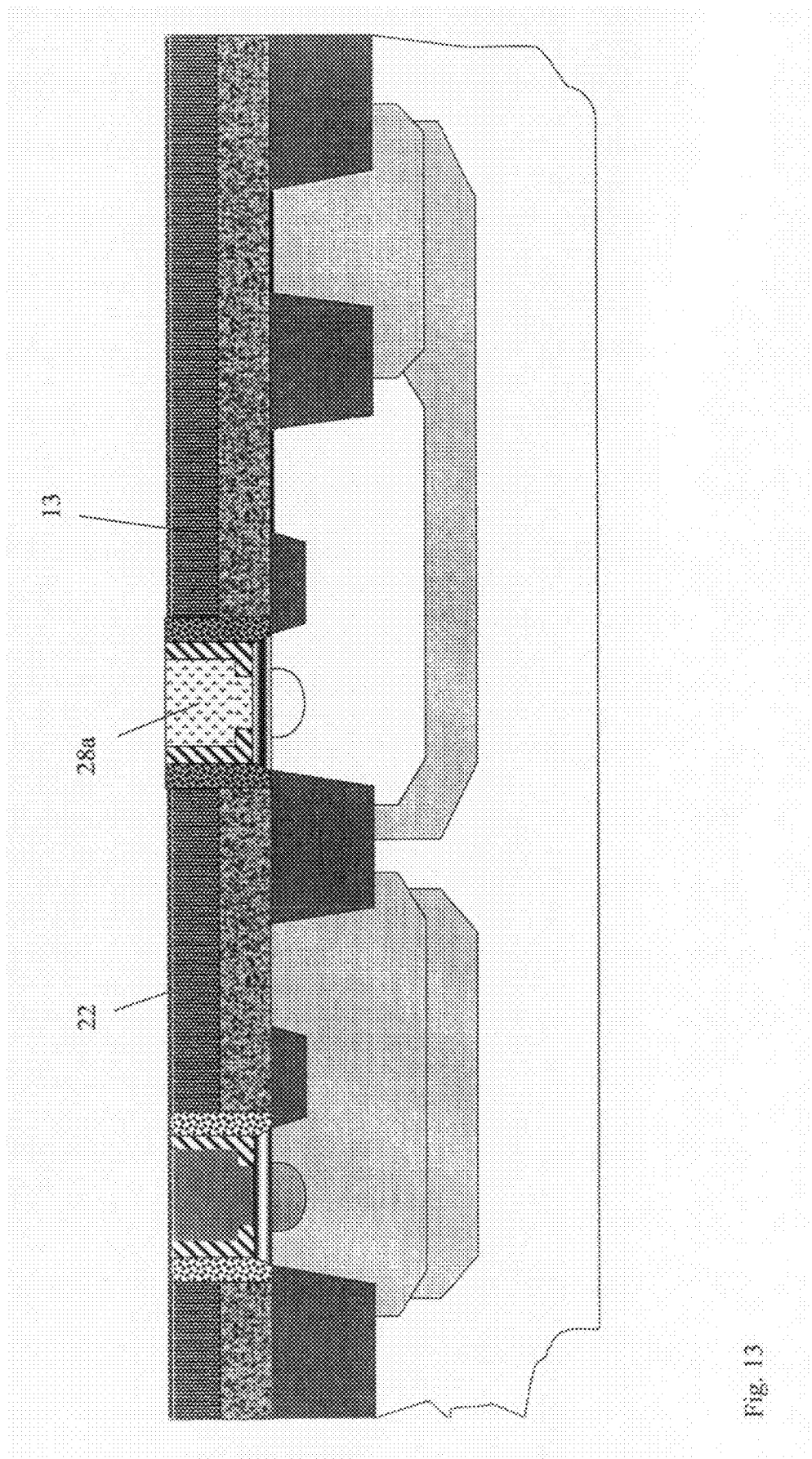
Figure 14:
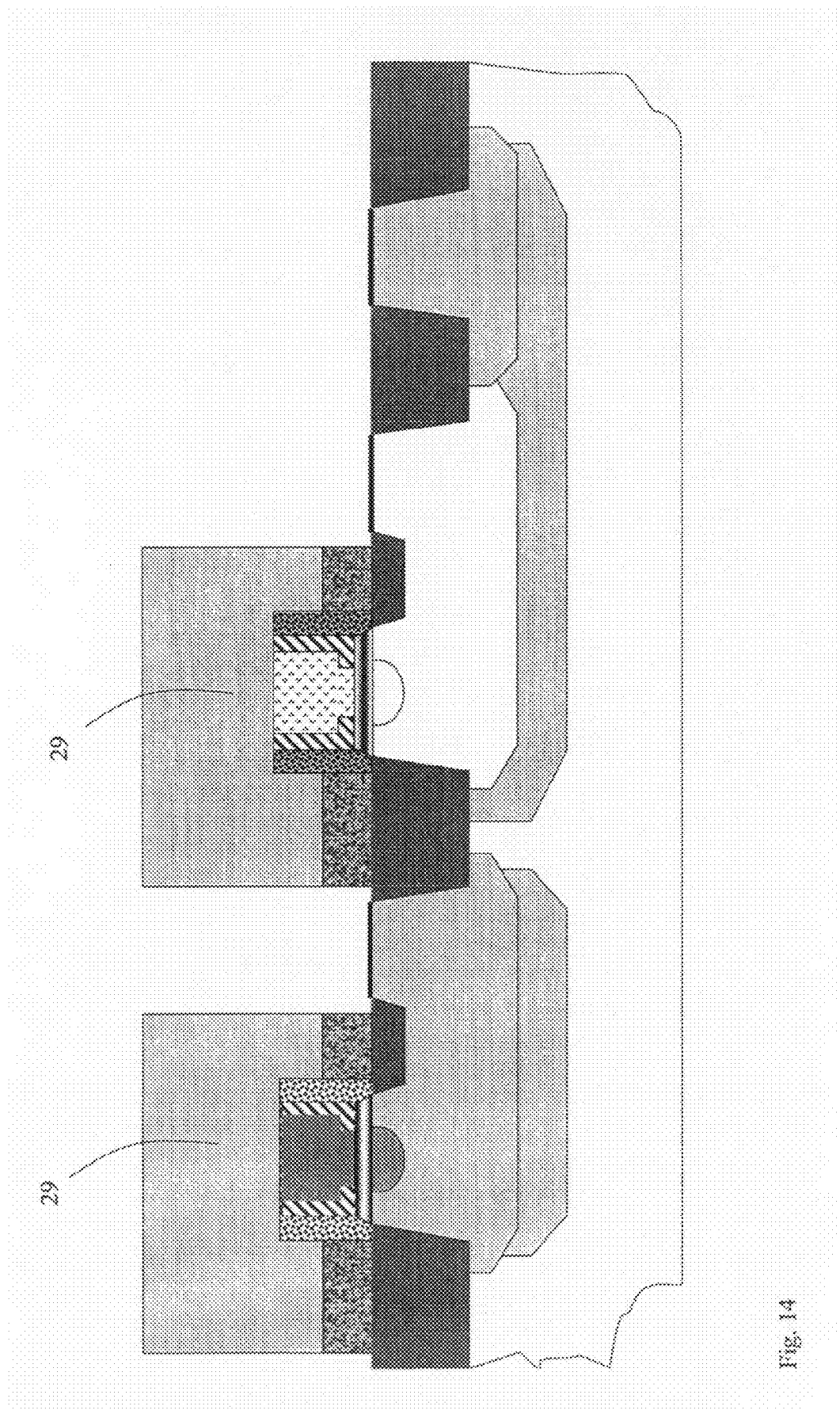

FIG. 11 shows the production of a hole 24 by means of a further additional lithographic step (lacquer mask 23) compared to the basic CMOS process. Before the formation of the lacquer mask 23, the procedure also involves the deposition of an insulator layer 22 of $SiO_2$ or $Si_3N_4$ serving to protect the npn structures already formed, during the subsequent process steps for the pnp transistor. Now, in an entirely similar fashion to the npn transistor the inner base, its connection to the outer base and the emitter of the pnp transistor are formed in the hole 24. Those steps are illustrated in FIGS. 12 and 13. Only the similarities with and differences from the npn transistor are described hereinafter.

The layer stack 25a and the layer 25b of the pnp transistor correspond to the stack 16a and the layer 16b of the npn transistor. It will be noted however that the SiGe-layers now include an n-doping. A similar variant to that shown in FIG. 7a for the npn transistor can also be implemented for the pnp transistor. The spacers 26 correspond to spacers 17 but can also differ from the spacers 17 in their dimensions. The selectively implanted collector of the pnp transistor is the p-conducting region 27. Emitter production now involves using the highly p-doped layer 28 whose planarised residues in the spacered hole 24, after CMP (and/or RIE), form the emitter 28a of the pnp transistor.

After preferably wet-chemical removal of the remaining layers 22 and 13, structuring of the CMOS gates is now effected in the CBiCMOS process. That structuring process is also applied to the CBi semiconductor device in the fashion shown in FIG. 14, and as a result does not require any additional process complication and expenditure, and in particular naturally also no additional lithographic step for the production of the lacquer mask 29.

Figure 15:
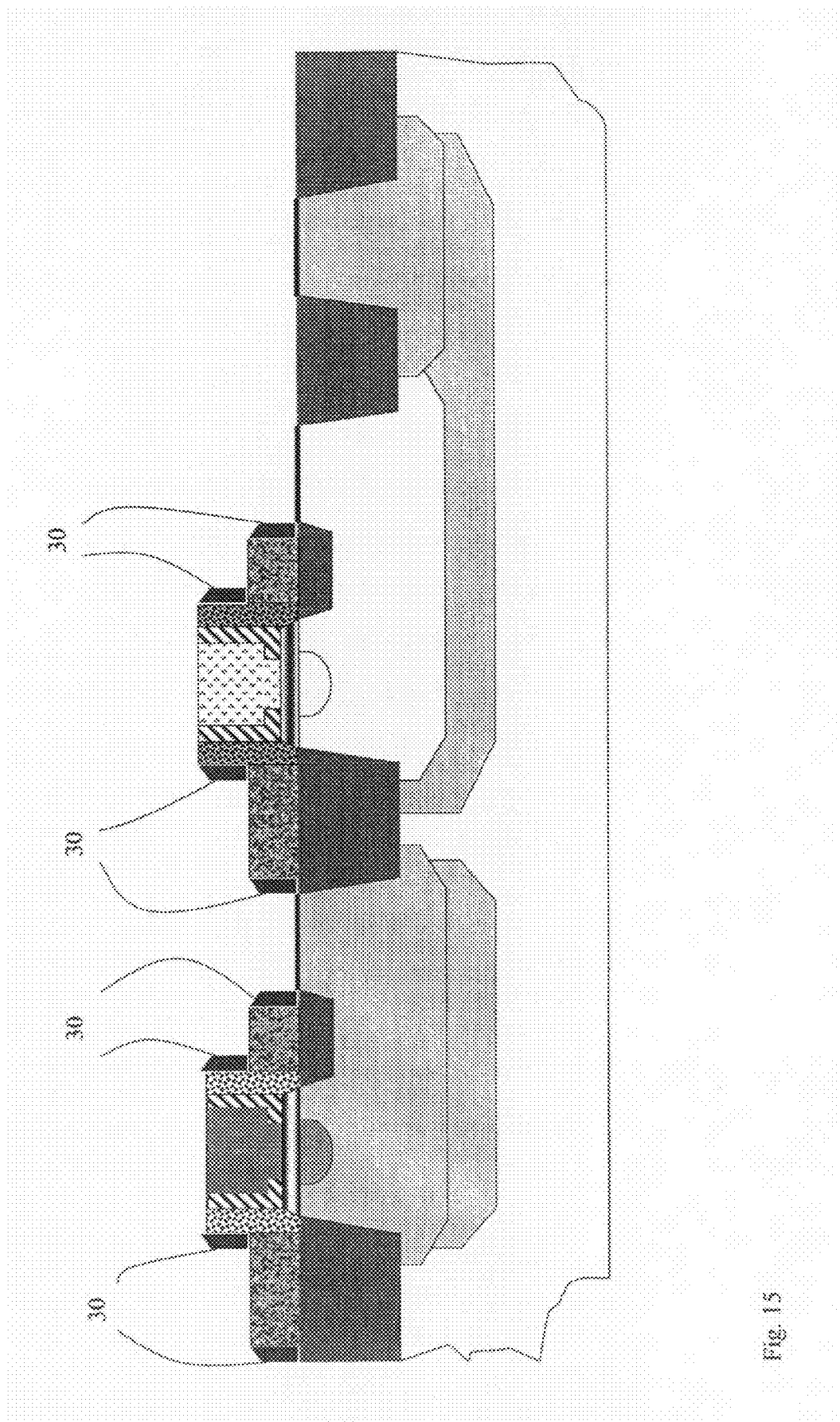

After the gate structuring operation spacers are typically formed at the gate side walls in the basic CMOS process, the spacers typically comprising $SiO_2$ or a combination of $SiO_2$ and $Si_3N_4$. Those spacers 30 are also formed at the bipolar structures, as illustrated in FIG. 15.

Figure 16:
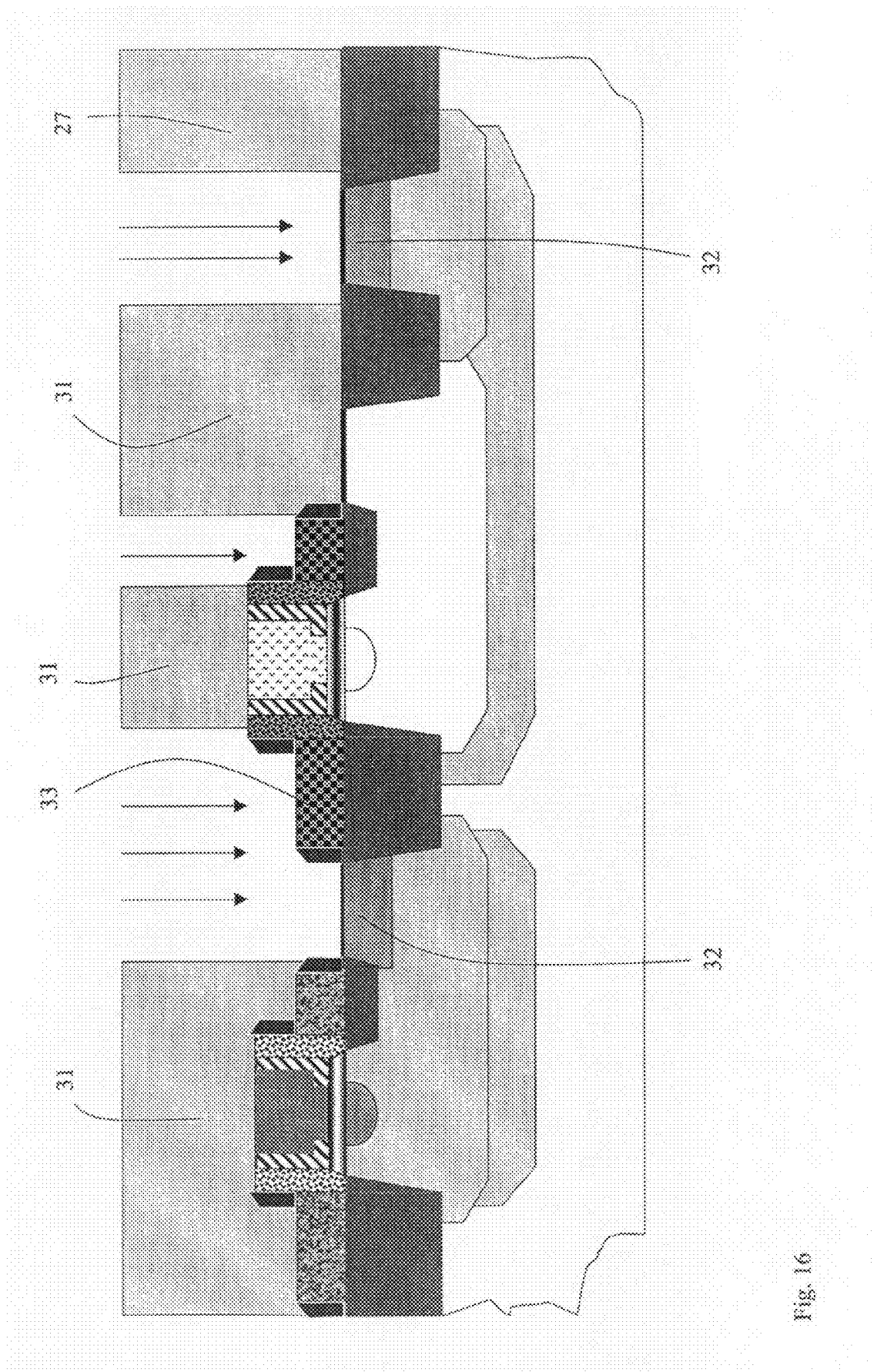
Figure 17:
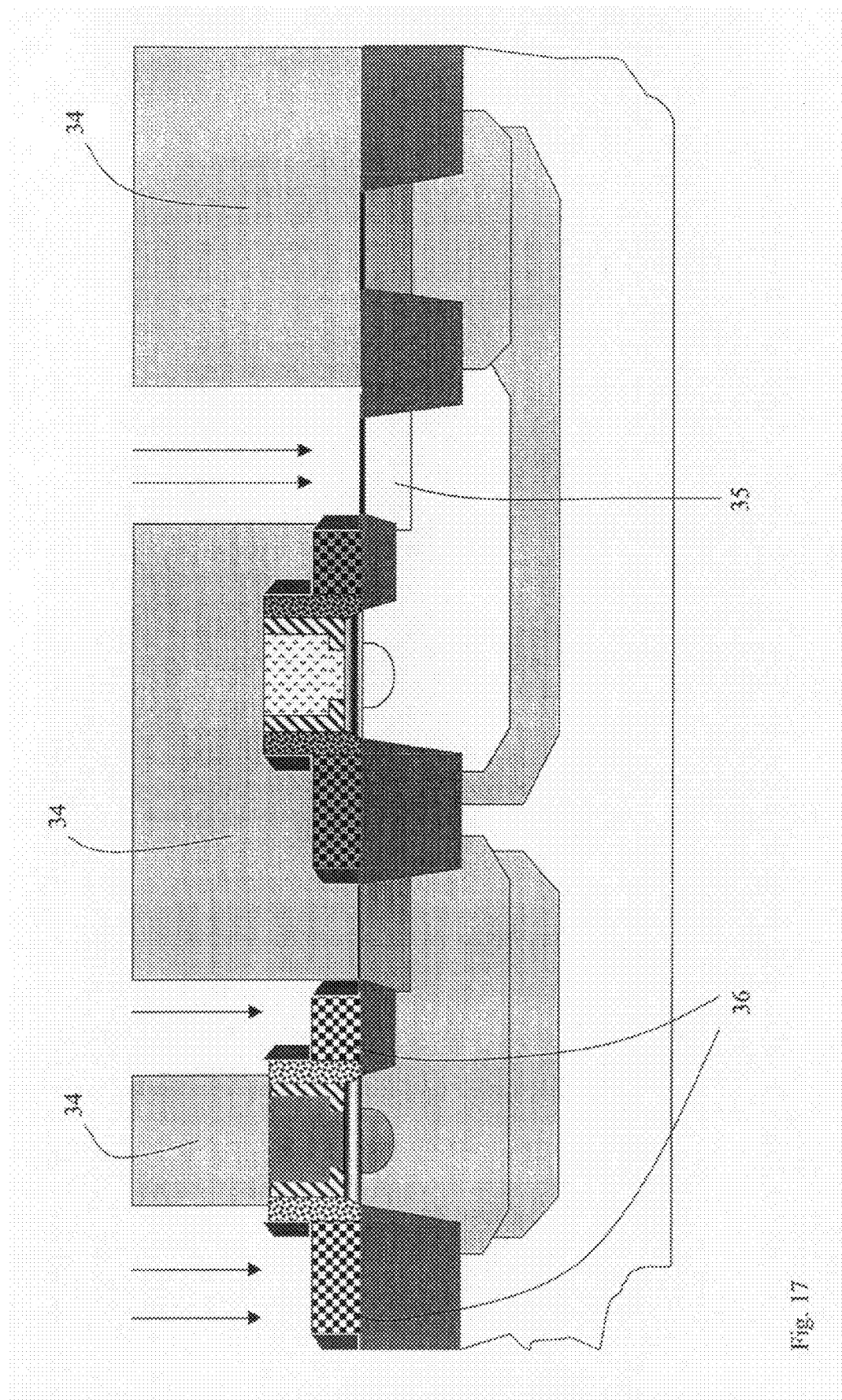

In the basic CMOS process, the procedure then involves implantation of the so-called source and drain regions of the CMOS transistors. That process sequence can now be utilized for completing the CBi semiconductor device without any additional complication and expenditure, compared to the basic CMOS process, as shown in FIGS. 16 and 17.

By virtue of a suitable layout of the mask 31 for the NMOS source-drain regions, it can also be used for implantation doping of the collector contact region 32 of the npn transistors, the contact region 32 for the insulating layer of the pnp transistors, and the polysilicon portions 33 which have a connection to the inner base of the pnp transistor. Likewise the mask 34 which serves for implantation doping of the PMOS source-drain regions can also be used for production of the collector contact region 35 of the pnp transistors and for doping of the polysilicon portions 36 which have the connection to the inner base of the npn transistor.

Figure 18:
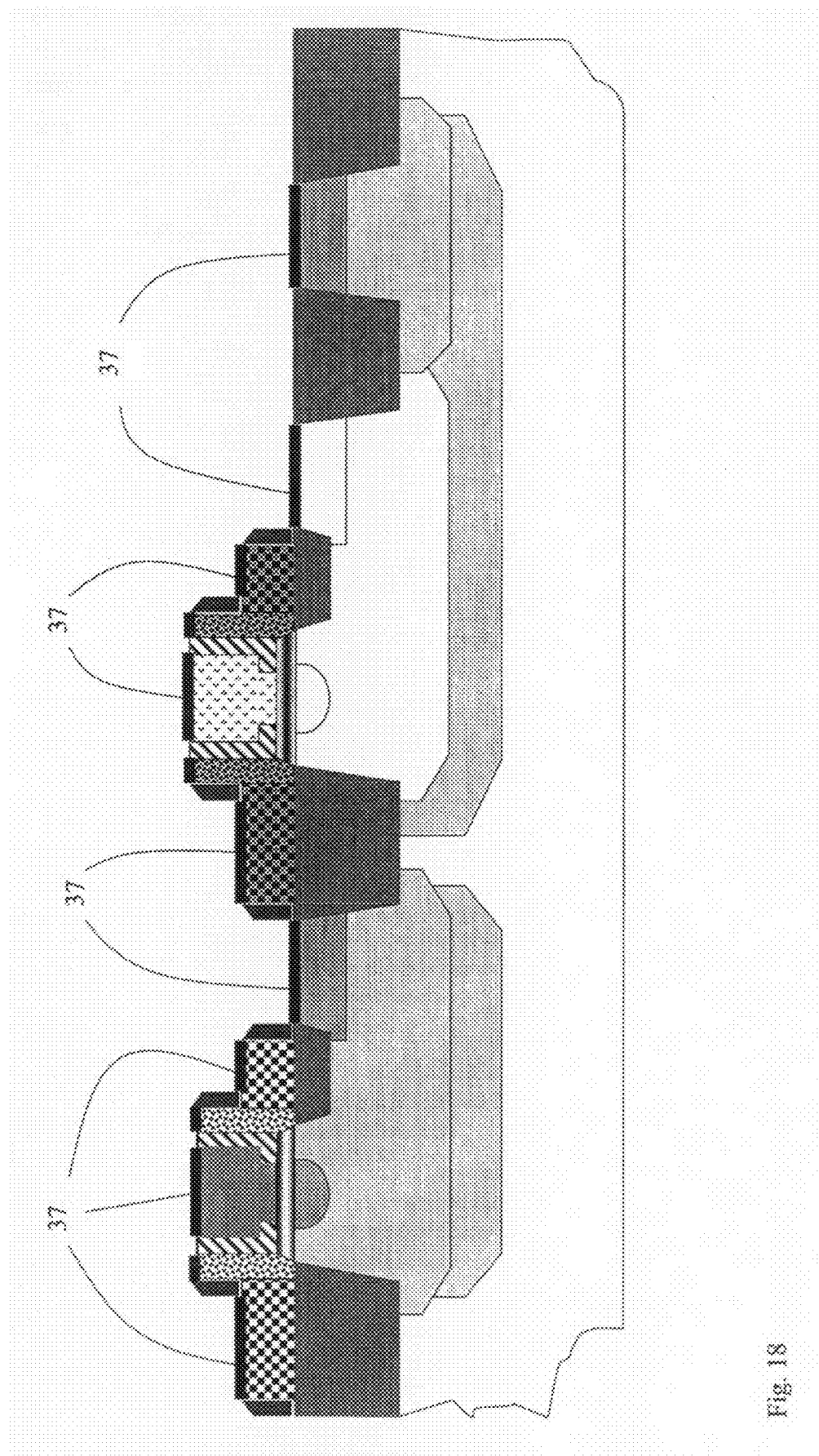

FIGS. 18 and 19 also show the step of finishing the CBi semiconductor device in the CBiCMOS process as far as structuring of a first conductor track plane by means of a process sequence which is usual in CMOS processes. Firstly silicide layers 37 are formed on all monocrystalline or polycrystalline silicon regions which are not covered with insulator (for example on a base of cobalt or titanium). Insulator deposition is then effected followed by planarisation thereof in respect to the layer 38. Contact holes are etched therein and filled with metal (for example tungsten). After a CMP step the contacts 39a-39b for the pnp transistor and 40a-40c for the npn transistor are produced. Then, the metal strips 41a-41d (pnp) and 42a-42c (npn) are structured above those contacts, the strips serving to connect the CBi semiconductor device into an integrated circuit.

To sum up inexpensive production of the CBi semiconductor device is made possible in a CBiCMOS process. Only a minimum of three additional mask steps are used, in comparison with the basic CMOS process, for the simultaneous production of various npn transistors (different collector variants per layout variation (FIGS. 4, 4a, 4b)) and a pnp transistor, in a CBiCMOS process. Those three mask steps are the steps required for production of the shallow trenches 5a and the holes 15 and 24. Improved high-frequency properties by optimization of the collector and insulation implants, such optimization being decoupled from the CMOS process, can be achieved by 2 further additional mask steps, that for implantation of the region 8a (npn transistor, FIG. 4c), and that for implantation of the regions 10a and 8b (pnp transistor, FIG. 4d). Inexpensive bipolar integration is additionally promoted by using the following steps of the basic CMOS process for the CBi semiconductor device: use of the CMOS well implants for the production of the bipolar collectors and the insulation thereof; the CMOS gate layer becomes an essential part of the outer base of the bipolar transistors; and doping of essential parts of the CBi semiconductor device is effected using the CMOS source-drain implants.

In addition the described process achieves modular integration in a basic CMOS process. The concept presented for integration of the CBi semiconductor device starts substantially only after deposition of the CMOS gate stack (layers 11 and 12) and already ends practically prior to structuring thereof. As the electrical properties of the CMOS transistors are essentially formatively influenced by the implantation steps which are carried out after the gate structuring operation (extensions, halo, source-drain), the bipolar integration presented has scarcely any influence on the CMOS parameters. In addition, by virtue of the use of exclusively low-temperature processes in the bipolar module (temperatures of lower than 800° C. for all bipolar layer deposition operations), influence on the CMOS well profiles is negligible or is so slight that it can be easily compensated by adaptation of the well implantation conditions.

The described CBi semiconductor device has very many features which are conducive to very good high-frequency properties, apart from the use of SiGe-layers and the improvement thereof by the integration of carbon:

(a) The use of the shallow insulation trench 5a (instead of the standard trench 7a) between the active transistor region and the collector contact region makes it possible to achieve low collector resistances jointly with a low base-collector capacitance. That is a crucial step forward in terms of cost reduction not only in connection with the bipolar integration illustrated here, which uses only implanted collectors and dispenses with the use of the much more expensive construction with epitaxially buried, low-ohmic subcollectors.

(b) By virtue of the illustrated spacer technology for the insulation of emitter and outer base the latter is self-adjusted in relation to the emitter, which has an advantageous effect on the implementation of low base resistances.

(c) The distance between the active transistor region and the base silicide is slight, which is also advantageous in terms of low base resistances.

What is claimed is:

1. A complementary bipolar semiconductor device, hereinafter referred to as a CBi semiconductor device, comprising:
    a substrate of a first conductivity type,
    active bipolar transistor regions in the substrate, in which a base, an emitter and a collector of vertical bipolar transistors are arranged,
    vertical epitaxial-base npn bipolar transistors in a first subset of the active bipolar transistor regions,
    vertical epitaxial-base pnp bipolar transistors in a second subset of the active bipolar transistor regions,
    at least one collector contact region which is respectively arranged adjoining an active bipolar transistor region, and
    shallow field insulation regions which respectively laterally delimit the active bipolar transistor regions and the at least one collector contact region, wherein the shallow field insulation regions form insulation regions in trench form which terminate approximately flush with the substrate surface,
    characterized in that arranged between the first or the second or both the first and also the second subset of active bipolar transistor regions on the one hand and the at least one adjoining collector contact region on the other hand is a respective shallow field insulation region of a first type with a first depthwise extent of between 50 and 200 nm in the direction of the substrate interior and shallow field insulation regions of a second type of a second greater depthwise extent than the first depthwise extent of between 300 and 600 nm delimit the active bipolar transistor regions and the at least one collector contact region viewed in cross-section at their sides facing away from each other.

2. A CBi semiconductor device as set forth in claim 1 in which the pnp bipolar transistors and the npn bipolar transistors have outer base regions which differ only in their conductivity type but not, apart from their conductivity concentration doping, in their material composition and thickness.

3. A CBi semiconductor device as set forth in claim 2 which additionally includes CMOS transistors and in which the outer base regions are formed from the same material layer from which gates of the CMOS transistors are formed.

4. A CBi semiconductor device as set forth in claim 1 in which the npn and pnp bipolar transistors have an emitter which is provided in an emitter window and which additionally has emitter regions which project beyond the emitter window by a length amount laterally and in directions perpendicularly to an edge of the emitter window.

5. A CBi semiconductor device as set forth in claim 4 in which the length amount by which the emitter regions project beyond the emitter window is equal in relation to each point of the window edge.

6. A CBi semiconductor device as set forth in claim 5 in which the emitter regions project beyond the emitter window in the case of the npn bipolar transistors by a different length amount from the case with the pnp bipolar transistors.

7. A CBi semiconductor device as set forth in claim 4 in which the length amount involves a respective value of between 30 and 80 nm in the npn bipolar transistors and the pnp bipolar transistors.

8. A CBi semiconductor device as set forth in claim 1 in which an insulation doping region is arranged between the collector and the substrate exclusively in that type of bipolar transistor in which the conductivity type of the substrate is the same as that of the collector region, the insulation doping region being adapted to electrically insulate the collector and the substrate from each other.

9. A CBi semiconductor device as set forth in claim 1 in which the shallow field insulation regions of the first type involve a depthwise extent of between 70 and 150 nm in the direction of the substrate interior.

* * * * *